United States Patent
Lee et al.

(10) Patent No.: US 9,543,300 B2
(45) Date of Patent: *Jan. 10, 2017

(54) CMOS TRANSISTOR, SEMICONDUCTOR DEVICE INCLUDING THE TRANSISTOR, AND SEMICONDUCTOR MODULE INCLUDING THE DEVICE

(71) Applicant: Samsung Electronics Co., Ltd., Suwon-si (KR)

(72) Inventors: Hye-Lan Lee, Hwaseong-si (KR); Hong-Bae Park, Seoul (KR); Sang-Jin Hyun, Suwon-si (KR); Yu-Gyun Shin, Seongnam-si (KR); Sug-Hun Hong, Yongin-si (KR); Hoon-Joo Na, Hwaseong-si (KR); Hyung-Seok Hong, Ansan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/054,571

(22) Filed: Feb. 26, 2016

(65) Prior Publication Data

US 2016/0204108 A1    Jul. 14, 2016

Related U.S. Application Data

(63) Continuation of application No. 12/972,961, filed on Dec. 20, 2010, now Pat. No. 9,287,199.

(30) Foreign Application Priority Data

Jan. 25, 2010    (KR) .................. 10-2010-0006553

(51) Int. Cl.
*H01L 29/76*    (2006.01)
*H01L 29/78*    (2006.01)
(Continued)

(52) U.S. Cl.
CPC ....... *H01L 27/092* (2013.01); *H01L 21/82385* (2013.01); *H01L 21/823842* (2013.01); (Continued)

(58) Field of Classification Search
CPC ................... H01L 2924/00; H01L 21/823842; H01L 21/82385; H01L 21/823871; H01L 23/485; H01L 27/0629; H01L 27/0805; H01L 27/0811; H01L 29/94; H01L 2924/0002; H01L 27/092; H01L 29/42376; H01L 29/4966
See application file for complete search history.

(56) References Cited

U.S. PATENT DOCUMENTS 5,231,306 A    7/1993    Meikle et al.
6,410,376 B1   6/2002    Ng et al.
(Continued)

FOREIGN PATENT DOCUMENTS

JP    2007-165872    6/2007
KR    2003-0002256   1/2003
(Continued)

OTHER PUBLICATIONS

"CMOS Transistor, Semiconductor Device Including the Transistor, and Semiconductor Module Including the Device" Specification, Drawings, Claims and Prosecution History, of U.S. Appl. No. 12/972,961, filed Dec. 20, 2010, by Hye-Lan Lee, et al.

*Primary Examiner* — Duy T Nguyen
(74) *Attorney, Agent, or Firm* — Onello & Mello LLP

(57) ABSTRACT

Provided are a CMOS transistor, a semiconductor device having the transistor, and a semiconductor module having the device. The CMOS transistor may include first and second interconnection structures respectively disposed in first and second regions of a semiconductor substrate. The first and second regions of the semiconductor substrate may (Continued)

have different conductivity types. The first and second interconnection structures may be disposed on the semiconductor substrate. The first interconnection structure may have a different stacked structure from the second interconnection structure. The CMOS transistor may be disposed in the semiconductor device. The semiconductor device may be disposed in the semiconductor module.

30 Claims, 19 Drawing Sheets

(51) Int. Cl.
*H01L 27/092* (2006.01)
*H01L 23/485* (2006.01)
*H01L 29/423* (2006.01)
*H01L 29/49* (2006.01)
*H01L 29/51* (2006.01)
*H01L 21/8238* (2006.01)
*H01L 27/06* (2006.01)
*H01L 27/08* (2006.01)
*H01L 29/94* (2006.01)

(52) U.S. Cl.
CPC .... *H01L 21/823871* (2013.01); *H01L 23/485* (2013.01); *H01L 27/0629* (2013.01); *H01L 27/0805* (2013.01); *H01L 27/0811* (2013.01); *H01L 29/42376* (2013.01); *H01L 29/4966* (2013.01); *H01L 29/517* (2013.01); *H01L 29/94* (2013.01); *H01L 2924/0002* (2013.01)

(56) References Cited

U.S. PATENT DOCUMENTS

| | | |
|---|---|---|
| 7,157,378 B2 | 1/2007 | Brask et al. |
| 7,381,608 B2 | 6/2008 | Brask et al. |
| 7,569,466 B2 | 8/2009 | Callegari et al. |
| 2004/0188850 A1* | 9/2004 | Lee ............... H01L 21/76843 257/774 |
| 2006/0008968 A1 | 1/2006 | Brask et al. |
| 2006/0065939 A1 | 3/2006 | Doczy et al. |
| 2006/0113675 A1 | 6/2006 | Chang et al. |
| 2006/0121678 A1 | 6/2006 | Brask et al. |
| 2006/0246740 A1 | 11/2006 | Cartier et al. |
| 2007/0138563 A1 | 6/2007 | Callegari et al. |
| 2007/0262451 A1 | 11/2007 | Rachmady et al. |
| 2008/0054464 A1 | 3/2008 | Ikeda et al. |
| 2008/0197500 A1 | 8/2008 | Yang et al. |
| 2009/0011552 A1 | 1/2009 | Doris et al. |
| 2009/0200668 A1 | 8/2009 | Yang et al. |
| 2009/0283830 A1 | 11/2009 | Callegari et al. |
| 2010/0068877 A1 | 3/2010 | Yeh et al. |
| 2010/0102399 A1 | 4/2010 | Hyun et al. |
| 2010/0258878 A1 | 10/2010 | Mise et al. |

FOREIGN PATENT DOCUMENTS

| | | |
|---|---|---|
| KR | 10-2007-0029840 | 3/2007 |
| KR | 10-2007-0086471 | 8/2007 |
| KR | 10-0867565 | 11/2008 |

* cited by examiner

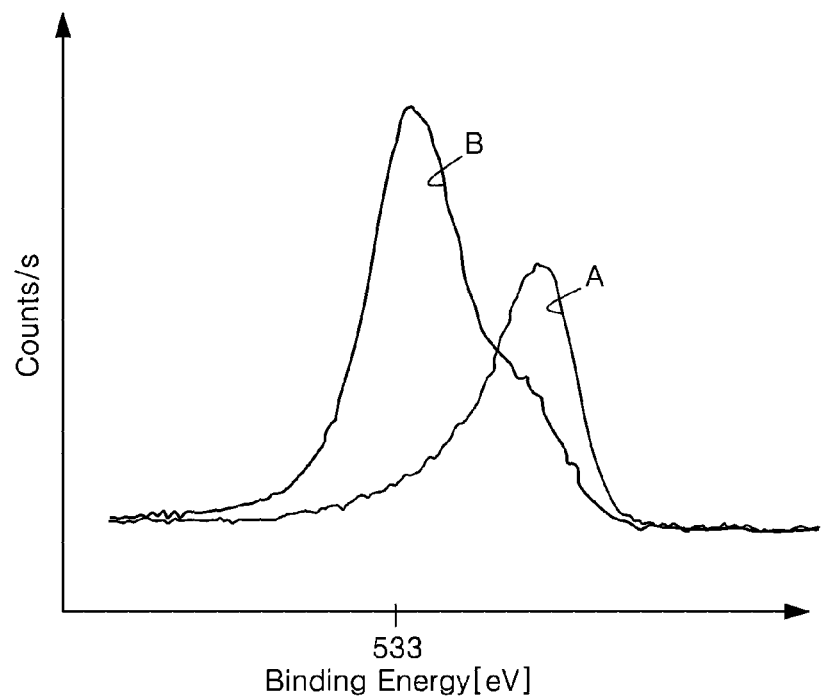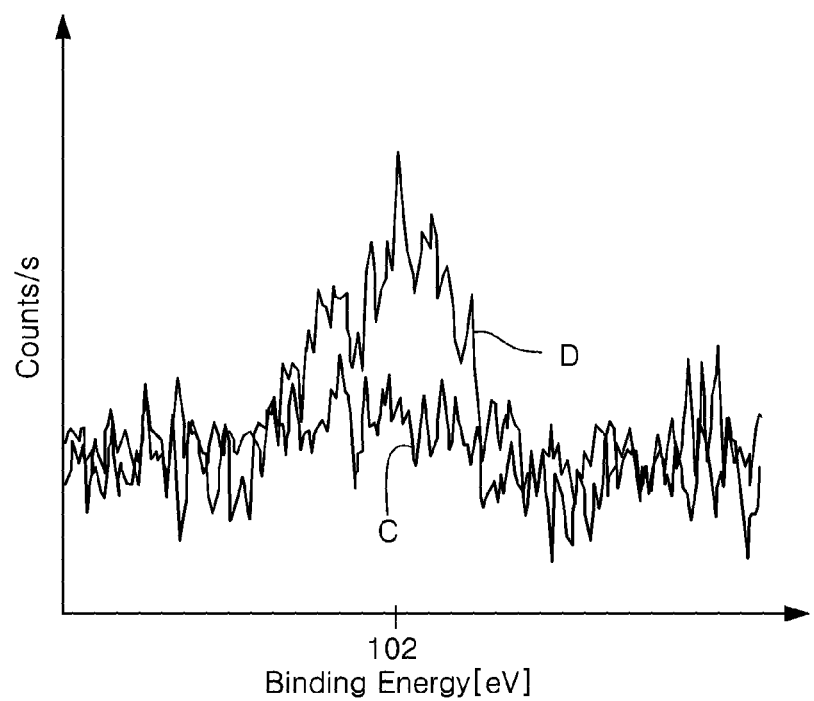

CMOS TRANSISTOR, SEMICONDUCTOR DEVICE INCLUDING THE TRANSISTOR, AND SEMICONDUCTOR MODULE INCLUDING THE DEVICE

CROSS-REFERENCE TO RELATED APPLICATION

This application is a continuation of U.S. patent application No. 12/972,961, filed on Dec. 20, 2010, now U.S. Pat. No. 9,287,199, which claims priority under 35 U.S.C. §119 to Korean Patent Application No. 10-2010-0006553 filed in the Korean Intellectual Property Office on Jan. 25, 2010, the entire contents of which are hereby incorporated by reference.

BACKGROUND

1. Field

The inventive concept relates to a complementary metal-oxide-semiconductor (CMOS) transistor, a semiconductor device including the transistor, and a semiconductor module including the device.

2. Description of Related Art

In general, a semiconductor device may include a gate structure formed on a semiconductor substrate. The gate structure controls the flow of charge between source and drain regions of a CMOS transistor. The gate structure may include a gate insulating pattern, a polysilicon (poly-Si) gate and a gate electrode that are sequentially stacked. The poly-Si gate may contain impurity ions. The poly-Si gate may determine the work function of the CMOS transistor along with the semiconductor substrate.

When driving the semiconductor device, the poly-Si gate may have a parasitic capacitance due to diffusion of the impurity ions. The parasitic capacitance of the poly-Si gate may degrade the current drivability of the CMOS transistor. In order to prevent generation of the parasitic capacitance of the CMOS transistor, the poly-Si gate has been replaced by a diffusion stopping pattern and a metal gate that are sequentially stacked. The metal gate may not develop a parasitic capacitance during the driving of the semiconductor device.

However, the metal gate may react with the gate electrode and diffuse constituent atoms of the gate electrode into the diffusion stopping pattern and/or the gate insulating pattern. In this case, the gate electrode, depending on semiconductor fabrication process conditions, may cause deviation of a threshold voltage of the CMOS transistor from its intended magnitude.

The CMOS transistor, which includes the metal gate and the gate electrode, may be disposed in a semiconductor module and a processor-based system. The electrical properties of the semiconductor module and the process-based system may be degraded by reaction of the metal gate with the gate electrode in the CMOS transistor.

SUMMARY

Embodiments of the inventive concept provide a CMOS transistor including interconnection structures, which may prevent diffusion of constituent atoms of a gate electrode.

Embodiments of the inventive concept also provide a semiconductor device including a CMOS transistor, which may prevent diffusion of constituent atoms of a gate electrode.

Embodiments of the inventive concept also provide a semiconductor module including the device.

Embodiments of the inventive concept provide a CMOS transistor including work-function adjusting materials disposed on a semiconductor substrate and diffusion stopping materials disposed under the work-function adjusting materials and having different stacked structures, and a semiconductor device and semiconductor module including the CMOS transistor.

According to one aspect, the inventive concept is directed to a CMOS transistor comprising a first interconnection structure and a second interconnection structure. The first interconnection structure is disposed in a first region of a semiconductor substrate and is configured to extend from a top surface of the semiconductor substrate toward an upper portion of the semiconductor substrate. The second interconnection structure is disposed in a second region of the semiconductor substrate and is configured to extend from the top surface of the semiconductor substrate toward the upper portion of the semiconductor substrate. Each of the first and second interconnection structures includes insulating material, diffusion stopping material, work-function adjusting material, and power applying material that are sequentially stacked, the insulating material and the diffusion stopping material are disposed in a lower portion of each of the first and second interconnection structures, and the diffusion stopping material of the first interconnection structure has a different stacked structure from the diffusion stopping material of the second interconnection structure.

In one embodiment, the CMOS transistor further includes an insulating layer disposed on the semiconductor substrate. The first region of the semiconductor substrate has a different conductivity type from the second region, the first and second interconnection structures have top surfaces in the upper portion of the semiconductor substrate, the insulating layer surrounds the first and second interconnection structures, and the top surfaces of the first and second interconnection structures are at substantially the same level as a top surface of the insulating layer.

In one embodiment, the CMOS transistor further includes first and second capping patterns disposed in the first and second interconnection structures, respectively, and an insulating layer configured to surround the first and second interconnection structures. The first region of the semiconductor substrate has a different conductivity type from the second region, the first and second capping patterns are disposed in upper portions of the first and second interconnection structures, respectively, and top surfaces of the first and second capping patterns are at substantially the same level as a top surface of the insulating layer.

In one embodiment, the CMOS transistor further includes first and second capping patterns disposed in the first and second interconnection structures, respectively, and an insulating layer configured to surround the first and second interconnection structures. The first region of the semiconductor substrate has a different conductivity type from the second region, the first and second interconnection structures protrude from a top surface of the insulating layer, extend toward the top surface of the insulating layer and sequentially dispose parallel to the top surface of the semiconductor substrate, and the first and second capping patterns are disposed in upper portions of the first and second interconnection structures, respectively.

In one embodiment, the CMOS transistor further includes an insulating layer configured to surround the first and second interconnection structures. The first region of the semiconductor substrate has a different conductivity type from the second region, the first and second interconnection structures have top surfaces in the upper portion of the semiconductor substrate, each of the top surfaces of the first and second interconnection structures is at the same level as or a different level from a top surface of the insulating layer.

According to another aspect, the inventive concept is directed to a semiconductor device including first and second interconnection structures. The first interconnection structure includes first and second buried patterns sequentially stacked in a first region of a semiconductor substrate to be parallel to a top surface of the semiconductor substrate, third and fourth buried patterns sequentially stacked on the second buried pattern to form a concave shape on the second buried pattern, and a fifth buried pattern disposed on the fourth buried pattern and surrounded by the third and fourth buried patterns. The second interconnection structure includes first and second stack patterns sequentially stacked in a second region of the semiconductor substrate to be parallel to the top surface of the semiconductor substrate, a third stack pattern having the concave shape on the second stack pattern and configured to extend from a top surface of the second stack pattern toward an upper portion of the semiconductor substrate, and a fourth stack pattern disposed on the third stack pattern and surrounded by the third stack pattern. The first buried pattern and the first stack pattern include insulating material, the second and third buried patterns and the second stack pattern include diffusion stopping material, the fourth buried pattern and the third stack pattern include work-function adjusting material, and the fifth buried pattern and the fourth stack pattern include power applying material.

In one embodiment, the semiconductor device further includes an insulating layer disposed on the semiconductor substrate. The insulating layer surrounds the first and second interconnection structures, the third through fifth buried patterns and the third and fourth stack patterns have substantially the same top surface in the upper portion of the semiconductor substrate, and the top surfaces of the third through fifth buried patterns and the third and fourth stack patterns are at substantially the same level as a top surface of the insulating layer.

In one embodiment, the semiconductor device further includes buried and stack capping patterns disposed in the first and second interconnection structures, respectively, and an insulating layer disposed on the semiconductor substrate and configured to surround the first and second interconnection structures. The third through fifth buried patterns and the third and fourth stack patterns have substantially the same top surface in the upper portion of the semiconductor substrate, the buried capping pattern is disposed on the third through fifth buried patterns, the stack capping pattern is disposed on the third and fourth stack patterns, and top surfaces of the buried and stack capping patterns are at substantially the same level as a top surface of the insulating layer.

In one embodiment, the semiconductor device further includes buried and stack capping patterns disposed in the first and second interconnection structures, respectively, and an insulating layer disposed on the semiconductor substrate and configured to surround the first and second interconnection structures. Upper portions of the third through fifth buried patterns protrude from a top surface of the insulating layer, extend to the top surface of the insulating layer, and are sequentially stacked to be parallel to the top surface of the semiconductor substrate, upper portions of the third and fourth stack patterns protrude from the top surface of the insulating layer, extend to the top surface of the insulating layer, and are sequentially stacked to be parallel to the top surface of the semiconductor substrate, the buried capping pattern is disposed on the fifth buried pattern, and the stack capping pattern is disposed on the fourth stack pattern.

In one embodiment, the semiconductor device further includes an insulating layer disposed on the semiconductor substrate and configured to surround the first and second interconnection structures. The third through fifth buried patterns have top surfaces disposed at the same level as or a different level from a top surface of the insulating layer in the upper portions of the semiconductor substrate, and the third and fourth stack patterns have top surfaces disposed at the same level as or a different level from the top surface of the insulating layer in the upper portions of the semiconductor substrate.

In one embodiment, the first region of the semiconductor substrate has a different conductivity type from the second region, and the insulating material includes one selected from the group consisting of hafnium-based material, lanthanide-based material, zirconium-based material, $Pr_2O_3$, $Dy_2O_3$, $Ba_xSr_yTiO_z$ (BST) material and $Pb(Zr, Ti)O_3$ (PZT) material.

In one embodiment, a lower portion of the diffusion stopping material of the first interconnection structure includes one of binary-based metal nitride and ternary-based metal nitride, and an upper portion of the diffusion stopping material of the first interconnection structure includes one selected from the group consisting of HfAlN, HfSiN, TaAlN, TaSiN, TiAlN and TiSiN.

In one embodiment, a lower portion of the diffusion stopping material of the first interconnection structure includes one of binary-based metal nitride and ternary-based metal nitride, and an upper portion of the diffusion stopping material of the first interconnection structure includes silicon nitride, silicon carbide or silicide of one selected from the group consisting of hafnium (Hf), molybdenum (Mo), tantalum (Ta), titanium (Ti) and tungsten (W).

In one embodiment, the diffusion stopping material of the second interconnection structure includes one of binary-based metal nitride and ternary-based metal nitride, or silicide nitride, silicon carbide or silicide of one selected from the group consisting of Hf, Mo, Ta, Ti and W.

In one embodiment, the work-function adjusting material is carbide, nitride, silicon nitride or silicide of one selected from the group consisting of Hf, Mo, Ta, Ti and W, or is one selected from the group consisting of platinum (Pt), ruthenium (Ru), iridium oxide (IrO) and ruthenium oxide (RuO), and the power applying material includes aluminum (Al) or a combination of Al and Si.

According to another aspect, the inventive concept is directed to a semiconductor module comprising a module substrate and at least one semiconductor package structure electrically connected to the module substrate and including at least one semiconductor device. The at least one semiconductor device comprises at least one complementary metal-oxide-semiconductor (CMOS) transistor disposed in a semiconductor substrate, and the at least one CMOS transistor comprises: a first interconnection structure disposed in a first region of the semiconductor substrate and configured to extend from a top surface of the semiconductor substrate toward an upper portion thereof; and a second interconnection structure disposed in a second region of the semiconductor substrate and configured to extend from the top surface of the semiconductor substrate toward the upper portion thereof. Each of the first and second interconnection structures includes insulating material, diffusion stopping material, work-function adjusting material, and power applying material that are sequentially stacked, the insulating material and the diffusion stopping material are disposed in a lower portion of each of the first and second interconnection structures, and the diffusion stopping material of the first interconnection structure has a different stacked structure from the diffusion stopping material of the second interconnection structure.

In one embodiment, the semiconductor module further comprises an insulating layer disposed on the semiconductor substrate. The first region of the semiconductor substrate has a different conductivity type from the second region, the first and second interconnection structures have top surfaces in the upper portion of the semiconductor substrate, the insulating layer surrounds the first and second interconnection structures, and the top surfaces of the first and second interconnection structures are at substantially the same level as a top surface of the insulating layer.

In one embodiment, the semiconductor module further comprises first and second capping patterns disposed in the first and second interconnection structures, respectively, and an insulating layer configured to surround the first and second interconnection structures. The first region of the semiconductor substrate has a different conductivity type from the second region, the first and second capping patterns are disposed in upper portions of the first and second interconnection structures, respectively, and top surfaces of the first and second capping patterns are at substantially the same level as a top surface of the insulating layer.

In one embodiment, the semiconductor module further comprises first and second capping patterns disposed in the first and second interconnection structures, respectively, and an insulating layer configured to surround the first and second interconnection structures. The first region of the semiconductor substrate has a different conductivity type from the second region, the first and second interconnection structure protrude from a top surface of the insulating layer, extend toward the top surface of the insulating layer and sequentially dispose parallel to the top surface of the semiconductor substrate, and the first and second capping patterns are disposed in upper portions of the first and second interconnection structures, respectively.

In one embodiment, the semiconductor module further comprises an insulating layer configured to surround the first and second interconnection structures. The first region of the semiconductor substrate has a different conductivity type from the second region, the first and second interconnection structures have top surfaces in the upper portion of the semiconductor substrate, each of the top surfaces of the first and second interconnection structures is at the same level as or a different level from a top surface of the insulating layer.

BRIEF DESCRIPTION OF THE DRAWINGS

The inventive concepts will be apparent from the more particular description of preferred embodiments thereof, as illustrated in the accompanying drawings in which like reference characters refer to the same parts throughout the different views. The drawings are not necessarily to scale, emphasis instead being placed upon illustrating the principles of the inventive concepts.

FIGS. 3 and 4 are X-ray photoelectron spectroscopy (XPS) graphs of the semiconductor sample of FIG. 1.

DETAILED DESCRIPTION OF EMBODIMENTS

Figure 1:
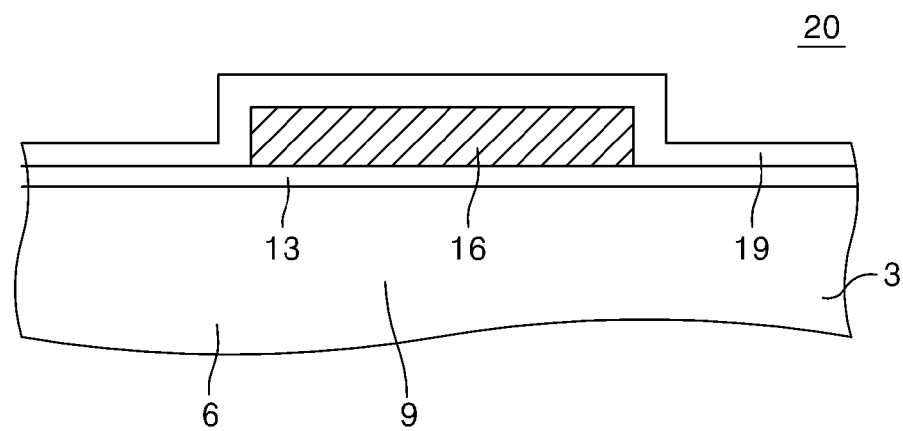
FIG. 1 is a schematic cross-sectional view of a semiconductor sample manufactured to embody a CMOS transistor according to embodiments of the inventive concept.

Various embodiments will now be described in detail with reference to the accompanying drawings in which some embodiments are shown. These inventive concepts may, however, be embodied in different forms and should not be construed as limited to the embodiments set forth herein. Rather, these embodiments are provided so that this description is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to"

or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a semiconductor device including a CMOS transistor according to embodiments of the inventive concept will be described in more detail with reference to FIGS. 1 through 8.

FIG. 1 is a schematic cross-sectional view of a semiconductor sample manufactured to embody a CMOS transistor according to embodiments of the inventive concept.

Referring to FIG. 1, in order to overcome problems of the prior art, a semiconductor sample 20 according to embodiments of the inventive concept may include a conductive pattern 16 disposed on a substrate 3. The substrate 3 may include single crystalline silicon (Si) or other material. The substrate 3 may include an impurity diffusion region 6 having a selected conductivity type. The impurity diffusion region 6 may have the same conductivity type as or a different conductivity type from the substrate 3. The impurity diffusion region 6 may include an active region 9.

The conductive pattern 16 may be disposed on the active region 9. The conductive pattern 16 may include titanium nitride. An isolation layer 13 may be disposed under the conductive pattern 16. The isolation layer 13 may include silicon dioxide ($SiO_2$) or insulating material having a higher dielectric constant than the $SiO_2$. A sacrificial layer 19 may be disposed on the conductive pattern 16.

In an embodiment, the sacrificial layer 19 may not be disposed on the conductive pattern 16. The sacrificial layer 19 may be disposed on the isolation layer 13 to cover the conductive pattern 16. The sacrificial layer 19 may be formed of polycrystalline silicon (poly-Si) or $SiO_2$. When the sacrificial layer 19 is formed of poly-Si, Si atoms of the poly-Si of the sacrificial layer 19 may diffuse into the conductive pattern 16.

When the sacrificial layer 19 is formed of $SiO_2$, Si atoms of the $SiO_2$ of the sacrificial layer 19 may diffuse into the conductive pattern 16. Accordingly, two semiconductor samples 20 were prepared according to two types of materials in the sacrificial layer 19. For comparison, other two semiconductor samples, which were not influenced by the sacrificial layer 19, were further prepared.

Figure 2:
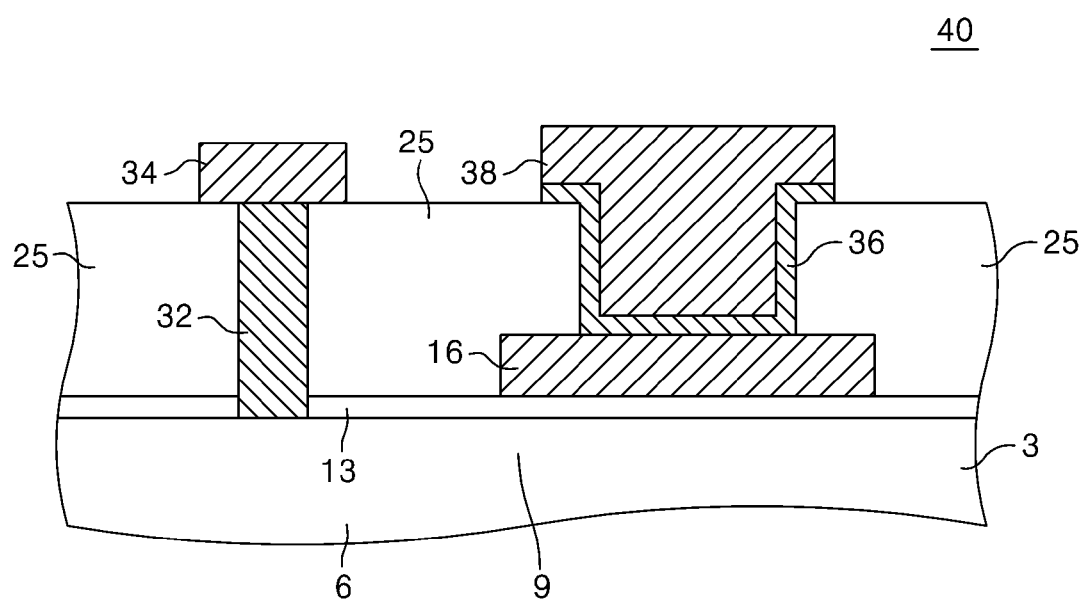
FIG. 2 is a schematic cross-sectional view of a MOS capacitor manufactured to embody a complementary MOS transistor according to embodiments of the inventive concept.

FIG. 2 is a schematic cross-sectional view of a MOS capacitor manufactured to embody a CMOS transistor according to embodiments of the inventive concept.

Referring to FIG. 2, a MOS capacitor 40 according to embodiments of the inventive concept may include the semiconductor substrate 3, the isolation layer 13, and the conductive pattern 16 of FIG. 1. The MOS capacitor 40 may not include the sacrificial layer 19 of FIG. 1. A planarization insulating layer 25 may be disposed on the substrate 3. The planarization insulating layer 25 may be disposed on the isolation layer 13 to cover the conductive pattern 16. The planarization insulating layer 25 may include $SiO_2$.

In this case, the extent of bonding between silicon and oxide in the planarization insulating layer 25 may be greater than that between silicon and oxide in the sacrificial layer 19. Alternatively, the planarization insulating layer 25 may include insulating material other than the sacrificial layer 19. A plug 32 and a first interconnection 34 may be disposed adjacent to the conductive pattern 16. The plug 32 may be in contact with the substrate 3 through the isolation layer 13 and the planarization insulating layer 25. The first interconnection 34 may be disposed on the planarization insulating layer 25 and in contact with the plug 32.

A barrier pattern 36 and a second interconnection 38 may be disposed on the conductive pattern 16. The barrier pattern 36 may have a concave shape and be disposed in the planarization insulating layer 25. The barrier pattern 36 may be in contact with the conductive pattern 16. The second interconnection 38 may be disposed on the planarization insulating layer 25 to fill the concave shape of the barrier pattern 36. The first and second interconnections 34 and 38 may include Al or a combination of Al and Si. In this case, the barrier pattern 36 may be formed of the same material as or different material from the plug 32.

Each of the plug 32 and the barrier pattern 36 may have a stacked structure of at least two layers. The plug 32 and the barrier pattern 36 may completely prevent diffusion of constituent atoms of the first and second interconnections 34 and 38. Accordingly, two MOS capacitors 40 were prepared according to two types of materials in the sacrificial layer 19 on the conductive pattern 16 as shown in FIG. 1. For comparison, two MOS capacitors, which were not influenced by the sacrificial layer 19 as shown in FIG. 2, were further prepared.

FIGS. 3 and 4 are X-ray photoelectron spectroscopy (XPS) graphs of a semiconductor sample of FIG. 1.

Referring to FIG. 3, first and second semiconductor samples A and B according to embodiments of the inventive concept were prepared. The first semiconductor sample A is formed to prevent the influence of the sacrificial layer 19 on the conductive pattern 16 of FIG. 1. The second semiconductor sample B is to diffuse silicon (Si) of poly-Si of the sacrificial layer 19 into the conductive pattern 16. Near-surface components in the conductive patterns 16 of the first and second semiconductor samples A and B were analyzed using an X-ray photoelectron spectroscope.

In the two-dimensional graph of FIG. 3, the abscissa denotes binding energy (eV), and the ordinate denotes the numbers (Counts/s) of constituent atoms extracted from the conductive pattern 16. The binding energy may refer to energy required to extract constituent atoms from conductive patterns. In this case, the X-ray photoelectron spectroscope confirmed titanium (Ti) in a near-surface depth of the conductive pattern 16 of the first semiconductor sample A.

The X-ray photoelectron spectroscope confirmed Si in a near-surface depth of the conductive pattern 16 of the second semiconductor sample B. A large amount of Si was extracted from the conductive pattern 16 at a binding energy of $533\pm\alpha$ eV.

Referring to FIG. 4, third and fourth semiconductor samples C and D according to embodiments of the inventive concept were prepared. The third semiconductor sample C is formed to prevent the influence of the sacrificial layer 19 of FIG. 1 on the conductive pattern 16 of FIG. 1. The fourth semiconductor sample D is to diffuse Si atoms of silicon dioxide of the sacrificial layer 19 into the conductive pattern 16. Near-surface components in the conductive patterns 16 of the third and fourth semiconductor samples C and D were analyzed using an X-ray photoelectron spectroscope.

As in FIG. 3, in the two-dimensional graph of FIG. 4, the abscissa denotes binding energy (eV), and the ordinate denotes the numbers (Counts/s) of constituent atoms extracted from the conductive pattern 16. In this case, the X-ray photoelectron spectroscope confirmed Ti in a near-surface depth of the conductive pattern 16 of the third semiconductor sample C. The X-ray photoelectron spectroscope confirmed Si in a near-surface depth of the conductive pattern 16 of the fourth semiconductor sample D. A large amount of Si was extracted from the conductive pattern 16 at a binding energy of $102\pm\alpha$ eV.

Figure 5:
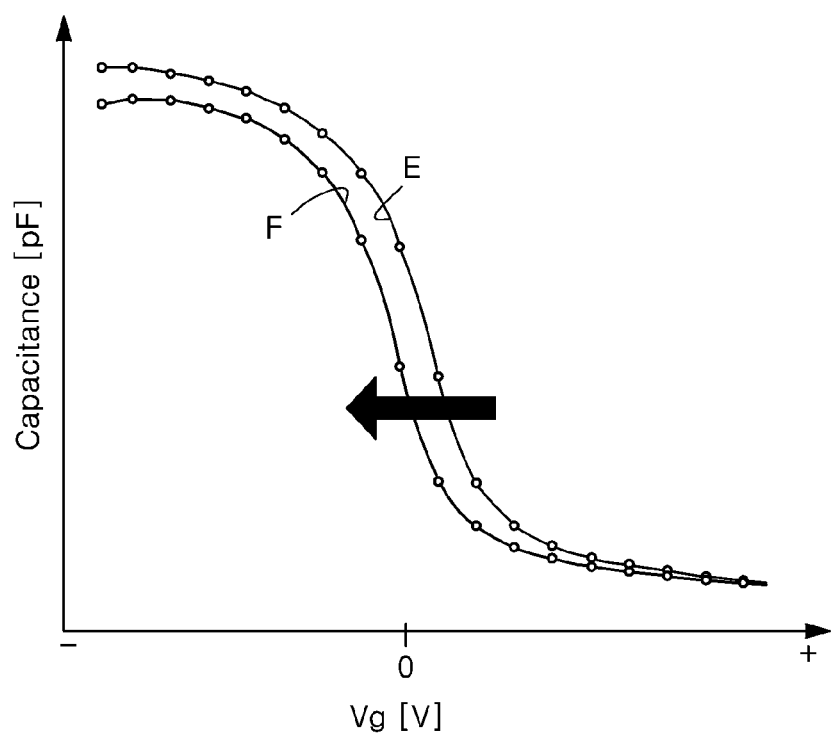
FIGS. 5 and 6 are graphs showing electrical characteristics of a MOS capacitor of FIG. 2.
Figure 6:
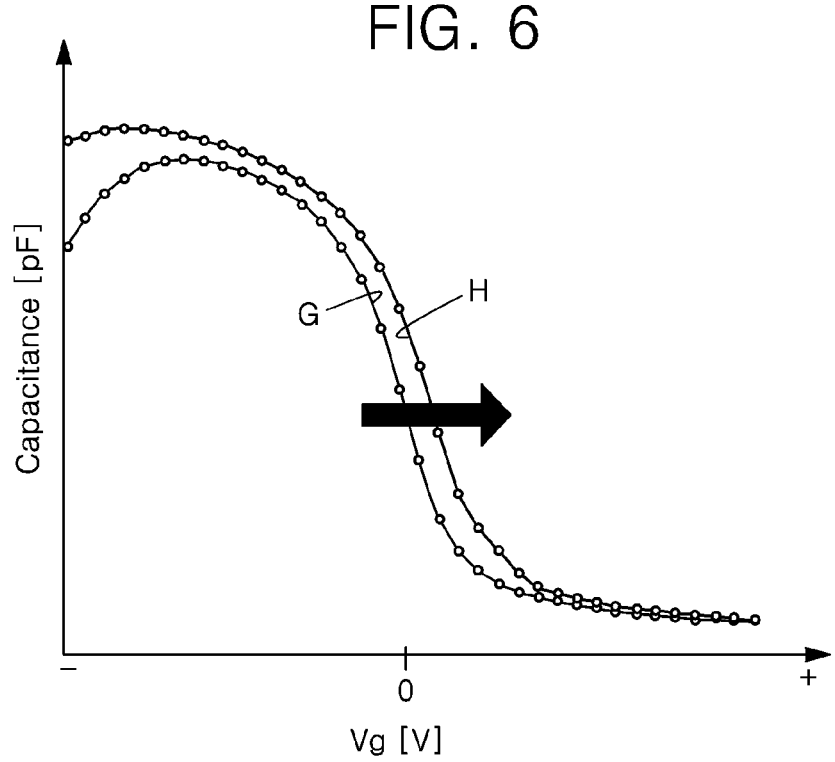

FIGS. 5 and 6 are graphs showing electrical properties of a MOS capacitor of FIG. 2.

Referring to FIG. 5, first and second MOS capacitors E and F according to embodiments of the inventive concept were prepared. The first MOS capacitor E is to prevent the influence of the sacrificial layer 19 of FIG. 1 on the conductive pattern 16. The second MOS capacitor F is to diffuse Si of poly-Si of the sacrificial layer 19 into the conductive pattern 16. A capacitance of each of the first and second MOS capacitors E and F were measured using a capacitance-voltage (C-V) measurement apparatus.

The C-V measurement apparatus may apply a ground voltage to the first interconnection 34 of FIG. 2 and a target voltage to the second interconnection 38 of FIG. 2 within a desired range based on the voltage applied to the first interconnection 34. In the two-dimensional graph of FIG. 5, the abscissa denotes a voltage Vg applied by the C-V measurement apparatus to the conductive pattern 16, and the ordinate denotes a capacitance. In this case, the second MOS capacitor F showed a smaller flat-band capacitance than the first MOS capacitor E.

The flat-band capacitance is a value obtained when a voltage of 0V is applied to the second interconnection 38 in each of the first and second MOS capacitors E and F. The flat-band capacitance may be related to a flat-band voltage in each of the first and second MOS capacitors E and F. The flat-band voltage may be proportional to a threshold voltage in each of the first and second MOS capacitors E and F. The threshold voltage of each of the first and second MOS capacitors E and F may be proportional to a threshold voltage of a CMOS transistor.

The second MOS capacitor F is shown to have a lower threshold voltage than the first MOS capacitor E. When the Si of the poly-Si of the sacrificial layer 19 diffuses into the conductive pattern 16, the second MOS capacitor F may provide a basis for stably reducing the threshold voltage of the CMOS transistor.

Referring to FIG. 6, third and fourth MOS capacitors G and H were prepared. The third MOS capacitor G is to prevent the influence of the sacrificial layer 19 of FIG. 1 on the conductive pattern 16. The fourth MOS capacitor H is to diffuse Si of silicon dioxide of the sacrificial layer 19 into the conductive pattern 16. A capacitance of each of the third and fourth MOS capacitors G and H was measured using a C-V measurement apparatus.

The C-V measurement apparatus may apply the same voltages as FIG. 5 to the first and second interconnections 34 and 38 of FIG. 1. As in FIG. 5, in the two-dimensional graph of FIG. 6, the abscissa denotes a voltage Vg applied by the C-V measurement apparatus to the conductive pattern 16, and the ordinate denotes a capacitance. In this case, the fourth MOS capacitor H showed a greater flat-band capacitance than the third MOS capacitor G. The fourth MOS capacitor H may have a higher threshold voltage than the third MOS capacitor G.

When the Si of the silicon dioxide of the sacrificial layer 19 diffuses into the conductive pattern 16, the fourth MOS capacitor H may provide a basis for stably increasing the threshold voltage of the CMOS transistor.

Due to the C-V characteristics of the fourth MOS capacitor, the immunity of a conventional CMOS transistor to a drop in a threshold voltage may be increased. Also, the fourth MOS capacitor provides an approach to improving electrical characteristics of a CMOS transistor compared with the prior art, together with the second MOS capacitor. To do this, embodiments of the inventive concept may provide a ternary-based metal nitride interposed between a diffusion stopping pattern and a metal gate of the prior art.

Figure 7:
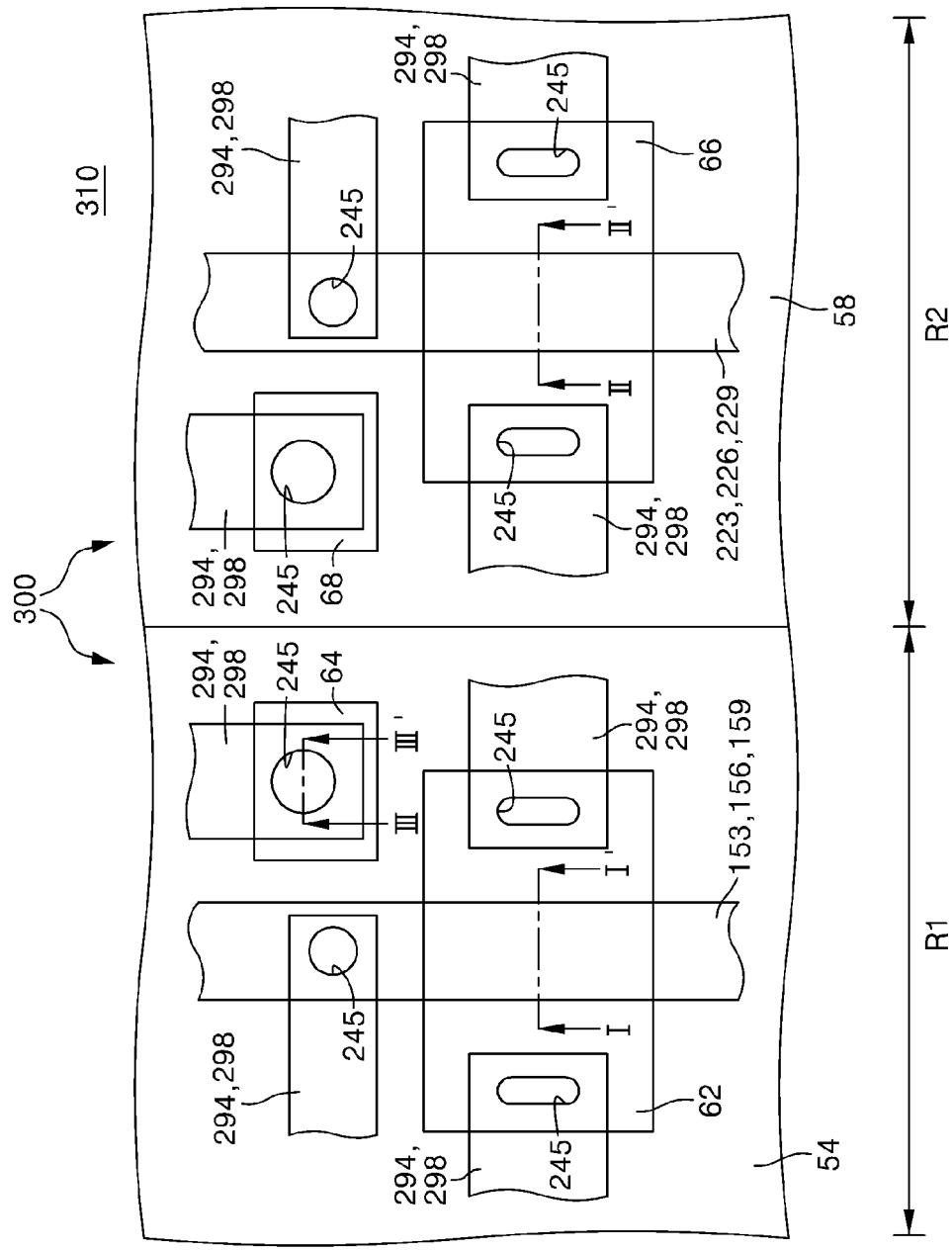
FIG. 7 is a schematic plan view of a semiconductor device according to embodiments of the inventive concept.

FIG. 7 is a schematic plan view of a semiconductor device according to embodiments of the inventive concept.

Referring to FIG. 7, a semiconductor device 310 according to embodiments of the inventive concept may include a first region R1 and a second region R2. The first and second regions R1 and R2 may have third interconnection structures 294 or 298, which are electrically insulated from one another. The first region R1 may have a p-type impurity diffusion region 54, which may have a selected third interconnection structure 294 or 298. A first interconnection structure 153, 156, or 159 and first and second active regions 62 and 64 may be disposed in the p-type impurity diffusion region 54 to overlap the selected third interconnection structure 294 or 298.

The first interconnection structure 153, 156, or 159 may be disposed across the first active region 62. The first interconnection structure 153, 156, or 159 and the first and second active regions 62 and 64 may be electrically connected to the selected third interconnection structure 294 or 298 through connection hole 245. In this case, the selected third interconnection structure 294 or 298 may constitute an n-type MOS (NMOS) transistor along with the p-type impurity diffusion region 54 and the first and second active regions 62 and 64.

The second region R2 may have an n-type impurity diffusion region 58. The n-type impurity diffusion region 58 may have the remaining third interconnection structures 294 or 298. A second interconnection structure 223, 226, or 229 and third and fourth active regions 66 and 68 may be disposed in an n-type impurity diffusion region 58. The second interconnection structure 223, 226, or 229 may be disposed across the third active region 66. The second interconnection structure 223, 226, or 229 and the third and fourth active regions 66 and 68 may be electrically connected to the remaining third interconnection structures 294 or 298 through the connection holes 245.

In this case, the remaining third interconnection structures 294 or 298 may constitute a p-type MOS (PMOS) transistor along with the n-type impurity diffusion region 58 and the third and fourth active regions 66 and 68. As a result, the PMOS transistor and the NMOS transistor may constitute a CMOS transistor 300 in the semiconductor device 310.

Figure 8:
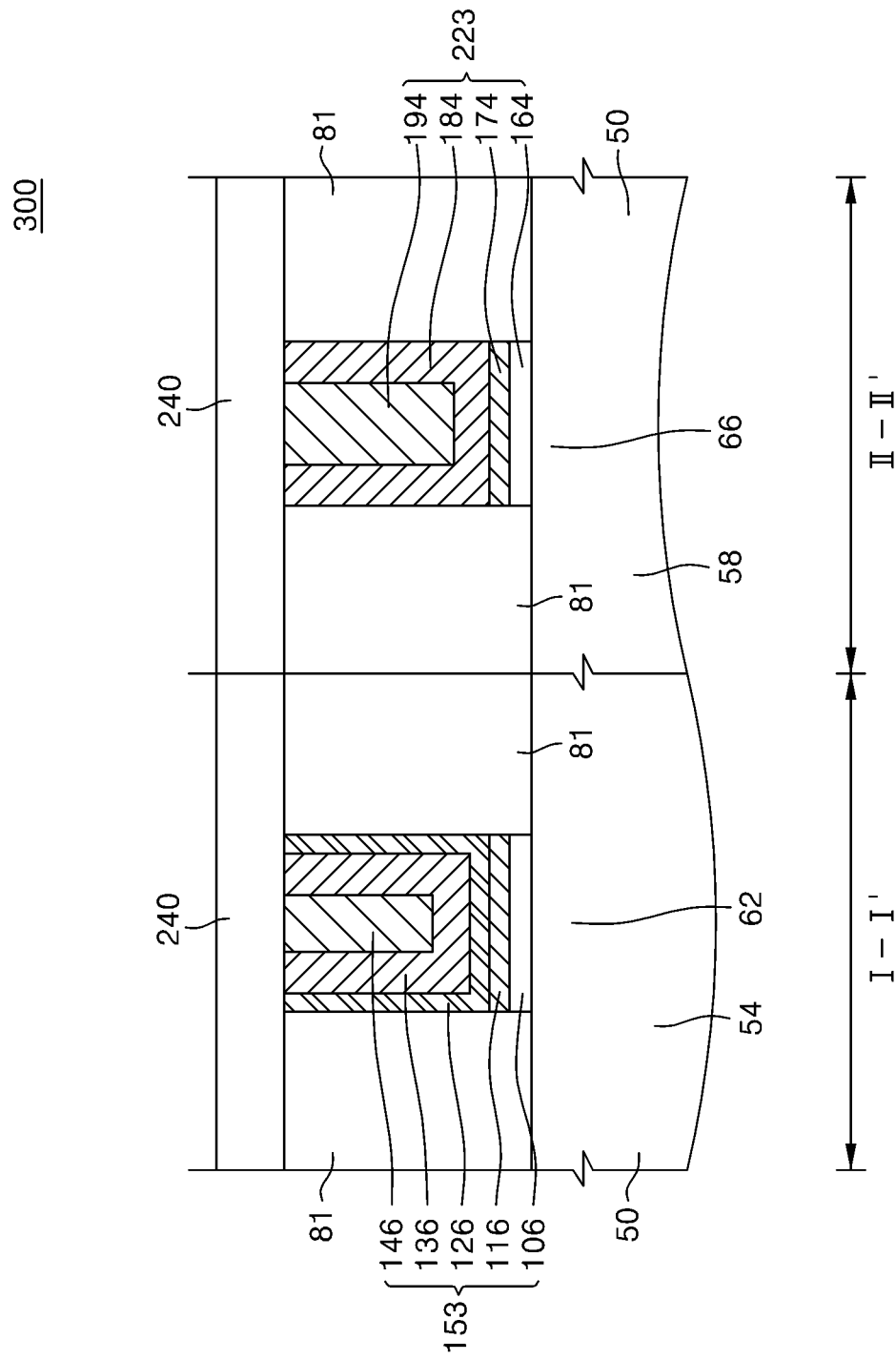
FIG. 8 is a schematic cross-sectional view of a CMOS transistor taken along lines I-I' and II-II' of FIG. 7.

FIG. 8 is a cross-sectional view of a CMOS transistor taken along lines I-I' and II-II' of FIG. 7.

Referring to FIG. 8, a CMOS transistor 300 according to embodiments of the inventive concept may include first and second interconnection structures 153 and 223 on a semiconductor substrate 50. The semiconductor substrate 50 may include the same material as or different material from the substrate 3 of FIG. 1. The first interconnection structure 153 may be disposed on a first active region 62 of a p-type impurity region 54 of the semiconductor substrate 50. The first interconnection structure 153 may extend from a top surface of the semiconductor substrate 50 toward an upper portion thereof. The first interconnection structure 153 may include first through fifth buried patterns 106, 116, 126, 136, and 146.

The first and second buried patterns 106 and 116 may be sequentially disposed on the semiconductor substrate 50 to be parallel to the top surface of the semiconductor substrate 50. The third and fourth buried patterns 126 and 136 may be sequentially stacked on the second buried pattern 116. The third and fourth buried patterns 126 and 136 may form a concave shape on the second buried pattern 116. Each of the third and fourth buried patterns 126 and 136 may have an opening toward the upper portion of the semiconductor substrate 50. The fifth buried pattern 146 may be disposed on the fourth buried pattern 136 and surrounded by the third and fourth buried patterns 126 and 136.

In this case, the first buried pattern 106 and/or the second buried pattern 116 may also be disposed along sidewalls of the third buried pattern 126. The first buried pattern 106 may include insulating material. The second and third buried patterns 116 and 126 may include diffusion stopping material. The third buried pattern 126 may include ternary-based metal nitride as the resultant material of FIGS. 1 through 6. The fourth buried pattern 136 may include work-function adjusting material.

The fourth buried pattern 136 may be a metal gate. The fifth buried pattern 146 may include power applying material. The fifth buried pattern 146 may be a gate electrode. First source and drain regions (not shown) may be disposed in the semiconductor substrate 50 adjacent to the first through fifth buried patterns 106, 116, 126, 136, and 146.

The second interconnection structure 223 may be disposed on a third active region 66 of an n-type impurity region 58 of the semiconductor substrate 50. The second interconnection structure 223 may extend from a top surface of the semiconductor substrate 50 toward an upper portion thereof. The second interconnection structure 223 may include first through fourth stack patterns 164, 174, 184, and 194. The first and second stack patterns 164 and 174 may be sequentially disposed on the semiconductor substrate 50 to be parallel to the top surface of the semiconductor substrate 50. The third stack pattern 184 may extend from a top surface of the second stack pattern 174 toward the upper portion of the semiconductor substrate 50. The third stack pattern 184 may form a concave shape on the second stack pattern 174.

The third stack pattern 184 may have an opening toward the upper portion of the semiconductor substrate 50. The fourth stack pattern 194 may be disposed on the third stack pattern 184 and may be surrounded by the third stack pattern 184. The third and fourth stack patterns 184 and 194 may have the substantially same top surface as the third through fifth buried patterns 126, 136, and 146 in the upper portion of the semiconductor substrate 50.

In this case, the first stack pattern 164 and/or the second stack pattern 174 may be also disposed along sidewalls of the third stack pattern 184. The first stack pattern 164 may include the same insulating material as or different insulating material from the first buried pattern 106. The second stack pattern 174 may include the same diffusion stopping material as or different diffusion stopping material from the second buried pattern 116. The third stack pattern 184 may include the same work-function adjusting material as or different work-function adjusting material from the fourth buried pattern 136. The fourth stack pattern 194 may include the same power applying material as or different power applying material from the fifth buried pattern 146.

Second source and drain regions (not shown) may be disposed in the semiconductor substrate 50 adjacent to the first through fourth stack patterns 164, 174, 184, and 194. A first insulating layer 81 may be disposed on the semiconductor substrate 50. The first insulating layer 81 may surround the first through fifth buried patterns 106, 116, 126, 136, and 146 and the first through fourth stack patterns 164, 174, 184, and 194. A top surface of the first insulating layer 81 may be at the substantially same level as top surfaces of the third through fifth buried patterns 126, 136, and 146 and the third and fourth stack patterns 184 and 194. A second insulating layer 240 may be disposed on the first insulating layer 81, the third through fifth buried patterns 126, 136, and 146, and the third and fourth stack patterns 184 and 194.

Embodiment 1

FIGS. 9 through 12 are schematic cross-sectional views taken along lines I-I' and II-IP of FIG. 7, illustrating a method of forming a CMOS transistor, according to embodiments of the inventive concept.

Figure 9:
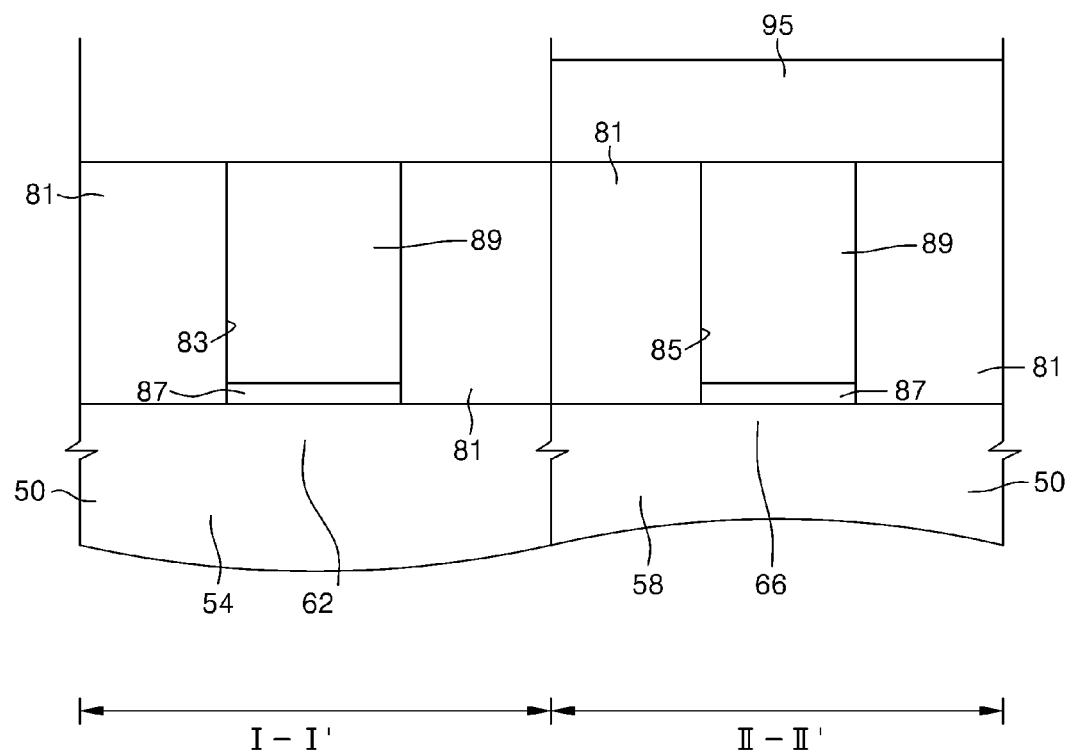
FIGS. 9 through 12 are schematic cross-sectional views taken along lines I-I' and II-II' of FIG. 7, illustrating a method of forming a CMOS transistor, according to embodiments of the inventive concept.

Referring to FIG. 9, according to embodiments of the inventive concept, a semiconductor substrate 50 may be prepared. The semiconductor substrate 50 may include the same material as or different material from the substrate 3 of FIG. 1. The semiconductor substrate 50 may include p- and n-type impurity diffusion regions 54 and 58. The p- and n-type impurity diffusion regions 54 and 58 may include first and third active regions 62 and 66, respectively. The first active region 62 may include first source and drain regions (not shown). The first source and drain regions may have a different conductivity type from the p-type impurity diffusion regions 54.

The third active region 66 may include second source and drain regions (not shown). The second source and drain regions may have a different conductivity type from the n-type impurity diffusion regions 58. A first insulating layer 81 may be formed on the semiconductor substrate 50 to cover the first and third active regions 62 and 66. The first insulating layer 81 may include insulating material having a different etch rate from the semiconductor substrate 50. First and second trenches 83 and 85 may be formed in the first insulating layer 81. The first trench 83 may expose the first active region 62 between the first source and drain regions.

The second trench 85 may expose the third active region 66 between the second source and drain regions. A protection layer 87 may be formed in the first and second trenches 83 and 85. The protection layer 87 may be disposed in lower portions of the first and second trenches 83 and 85 to cover the semiconductor substrate 50. The protection layer 87 may include material having the same etch rate as or a different etch rate from the semiconductor substrate 50 and/or the first insulating layer 81. Threshold-voltage adjusting impurity ions may or may not be implanted into the semiconductor substrate 50 within the first and second trenches 83 and 85 using the first insulating layer 81 and the protection layer 87 as a buffer layer.

The threshold-voltage adjusting impurity ions in the first trench 83 may have the same conductivity type as or a different conductivity type from the threshold-voltage adjusting impurity ions in the second trench 85. Fill patterns 89 may be formed in the first and second trenches 83 and 85. The fill patterns 89 may be disposed on the protection layer 87 to fill the first and second trenches 83 and 85. The fill patterns 89 may include material having the same etch rate as or a different etch rate from the protection layer 87. A first mask pattern 95 may be formed on the first insulating layer 81 in the third active region 66. The first mask pattern 95 may cover the entire n-type impurity diffusion region 58 of FIG. 7.

The first mask pattern 95 may include material having the same etch rate as or a different etch rate from the first insulating layer 81 and the fill patterns 89.

Figure 10:
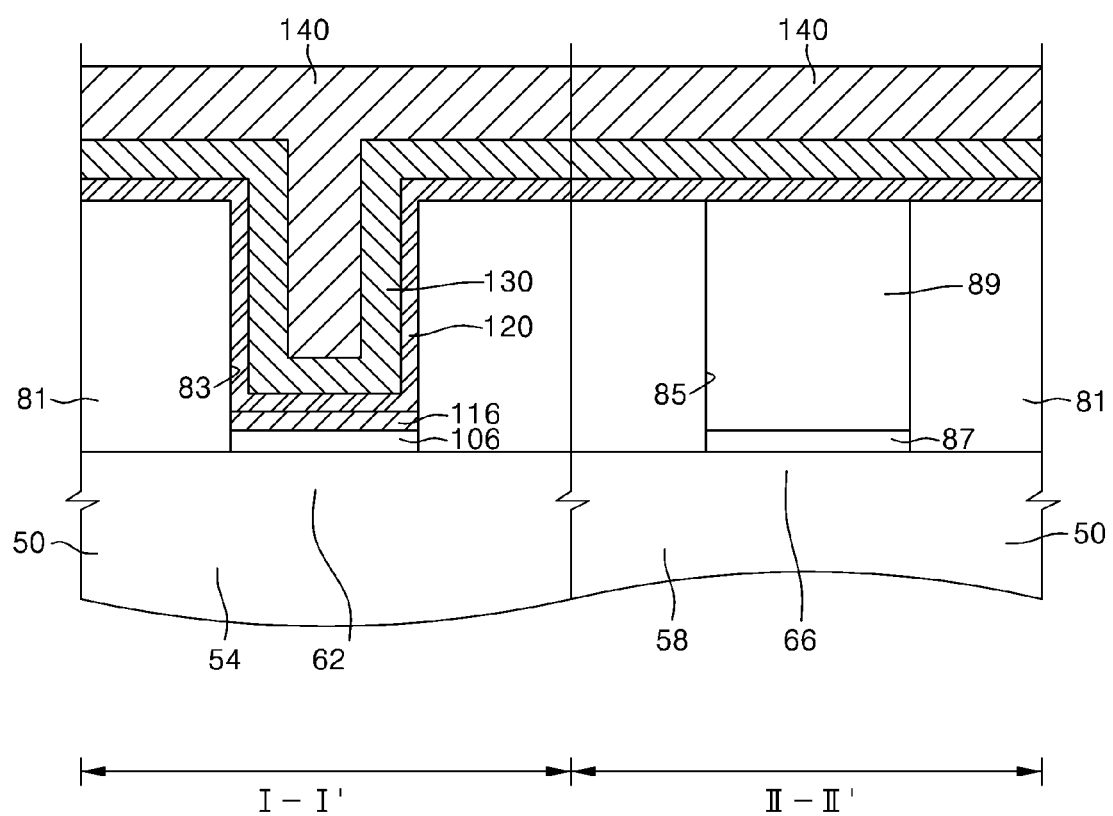

Referring to FIG. 10, according to embodiments of the inventive concept, the fill pattern 89 may be removed from the first trench 83 using the first mask pattern 95 of FIG. 9 as an etch mask and using the first insulating layer 81 and the protection layer 87 as an etch buffer layer. The protection layer 87 may be removed from the first active region 62 using the first mask pattern 95 as an etch mask and using the semiconductor substrate 50 and the first insulating layer 81 as an etch buffer layer. After removing the protection layer 87, the first mask pattern 95 may be removed from the third active region 66.

Thereafter, first and second buried patterns 106 and 116 and third through fifth buried layers 120, 130, and 140 may be sequentially formed on the semiconductor substrate 50 to fill the first trench 83. The first and second buried patterns 106 and 116 may be formed in a lower portion of the first trench 83 and cover the first insulating layer 81 and the fill pattern 89. The third and fourth buried layers 120 and 130 may conformally cover the first trench 83. The fifth buried layer 140 may be disposed on the fourth buried layer 130 to fill the first trench 83.

The first buried pattern 106 may include insulating material. The insulating material may include hafnium-based material and lanthanide-based material. The hafnium-based material may include HfAlO, HfLaO, $HfO_2$, HfON, HfSiO, or HfSiON. The lanthanide-based material may include $La_2O_3$ or $LaAlO_3$. The insulating material may also include zirconium-based material, dysprosium oxide ($Dy_2O_3$), praseodymium oxide ($Pr_2O_3$), $Ba_xSr_yTiO_z$ (BST) material, or $Pb(Zr, Ti)O_3$ (PZT) material.

The zirconium-based material may include $ZrO_2$, ZrSiO, or ZrSiON. The first buried pattern 106 may be formed using a chemical vapor deposition (CVD) process, a physical vapor deposition (PVD) process, an atomic layer deposition (ALD) process, or a combination thereof. The second buried pattern 116 may include first diffusion stopping material. The first diffusion stopping material may include one of binary-based metal nitride and ternary-based metal nitride.

The binary-based metal nitride may include HfN, TaN, TiN, or WN. The ternary-based metal nitride may include HfAlN, TaAlN, or TiAlN. The second buried pattern 116 may be formed using a CVD process, a PVD process, an ALD process, or a combination thereof. The third buried layer 120 may include second diffusion stopping material. The second diffusion stopping material may include HfAlN, HfSiN, TaAlN, TaSiN, TiAlN, or TiSiN.

The formation of the second diffusion stopping material may include performing a plasma-enhanced CVD (PECVD) process using a target including a metal-silicon-nitride or a metal-aluminum-nitride, or implanting Si ions into a binary-based metal nitride. The metal-aluminum-nitride may prevent diffusion of constituent atoms of the fifth buried layer 140. Alternatively, the formation of the second diffusion stopping material may include depositing silicon and/or silicon nitride on binary-based metal nitride using an ALD process and removing the silicon and/or the silicon nitride from the binary-based metal nitride. Alternatively, the formation of the second diffusion stopping material may include depositing silicon oxide on binary-based metal nitride using a CVD process and removing the silicon oxide from the binary-based metal nitride.

The second diffusion stopping material may include silicon nitride, silicon carbide, or silicide of one selected from the group consisting of hafnium (Hf), molybdenum (Mo), tantalum (Ta), titanium (Ti), and tungsten (W). The fourth buried layer 130 may include work-function adjusting material. The work-function adjusting material may include carbide, nitride, silicon nitride, or silicide of one selected from the group consisting of Hf, Mo, Ta, Ti, and W.

The work-function adjusting material may also include platinum (Pt), ruthenium (Ru), iridium oxide (40), and ruthenium oxide (RuO). The fourth buried layer 130 may be formed using a CVD process, a PVD process, an ALD process, or a combination thereof. The fifth buried layer 140 may include power applying material. The power applying material may include Al or a combination of Al and Si. The fifth buried layer 140 may be formed using a CVD process, a PVD process, an ALD process, or a combination thereof.

In this case, the second buried pattern 116 and the third buried layer 120 may completely prevent diffusion of constituent atoms of the fifth buried layer 140 from the fourth buried layer 130 to the first buried pattern 106.

Figure 11:
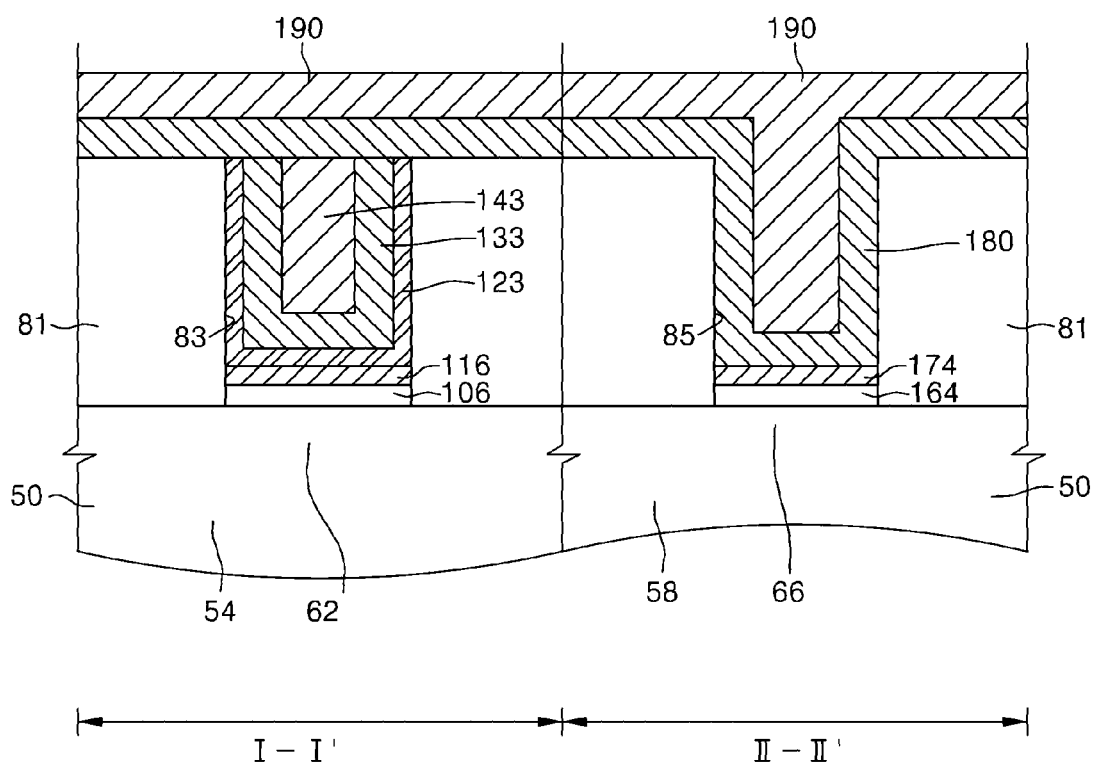

Referring to FIG. 11, according to embodiments of the inventive concept, an etchback process and/or a chemical mechanical polishing (CMP) process may be performed on the third through fifth buried layers 120, 130, and 140 of FIG. 10. That is, the third through fifth buried layers 120, 130, and 140 may be etched using the etchback process and/or the CMP process to form third through fifth preliminary buried patterns 123, 133, and 143. The third through fifth preliminary buried patterns 123, 133, and 143 may be formed to expose the first insulating layer 81 and fill the first trench 83 in the first active region 62.

Furthermore, the third through fifth preliminary buried patterns 123, 133, and 143 may expose the first insulating layer 81 and the fill pattern 89 in the third active region 66. After forming the third through fifth preliminary buried patterns 123, 133, and 143, a second mask pattern (not shown) may be formed on the first insulating layer 81 to cover the third through fifth preliminary buried patterns 123, 133, and 143. The second mask pattern may cover the entire p-type impurity diffusion region 54 of FIG. 7.

The second mask pattern may include material having the same etch rate as or a different etch rate from the first insulating layer 81 and the third through fifth preliminary buried patterns 123, 133, and 143. The fill pattern 89 may be removed from the second trench 85 using the second mask pattern of the first active region 62 and the first insulating layer 81 of the third active region 66 as an etch mask and an etch buffer layer, respectively. Subsequently, the protection layer 87 may be removed using the second mask pattern as an etch mask and using the semiconductor substrate 50 and the first insulating layer 81 as an etch buffer layer.

After removing the protection layer 87 of the third active region 66, the second mask pattern may be continuously removed from the first active region 62. First and second stack patterns 164 and 174 and third and fourth stack layers 180 and 190 may be sequentially formed on the semiconductor substrate 50 to fill the second trench 85. The first and second stack patterns 164 and 174 may be formed in a lower portion of the second trench 85. The first stack pattern 164 may include insulating material. The first stack pattern 164 may include the same material as or different material from the first buried pattern 106. The second stack pattern 174 may include diffusion stopping material.

The second stack pattern 174 may include the same material as or different material from the second buried pattern 116. The second stack pattern 174 may also include the same material as the third preliminary buried pattern 123. The third stack layer 180 may include work-function adjusting material. The third stack layer 180 may include the same material as or different material from the fourth preliminary buried pattern 133. The fourth stack layer 190 may include power applying material. The fourth stack layer 190 may include the same material as or different material from the fifth preliminary buried pattern 143.

In this case, the third buried layer 120 of FIG. 10 may also be formed between the second stack pattern 174 and the third stack layer 180.

Figure 12:
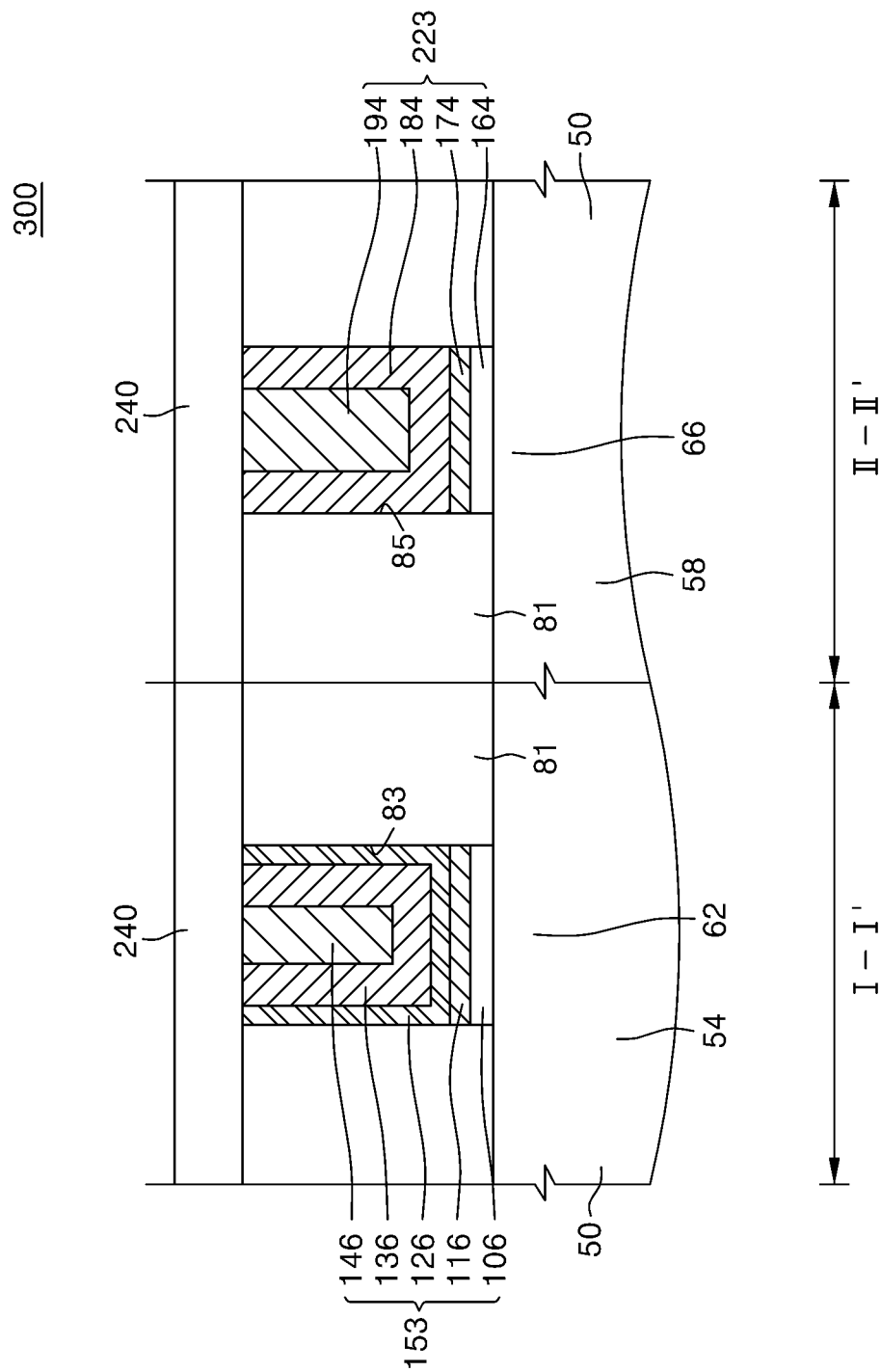

Referring to FIG. 12, according to embodiments of the inventive concept, an etchback process and/or a CMP process may be performed on the third through fifth preliminary buried patterns 123, 133, and 143 of FIG. 11, and third and fourth stack layers 180 and 190. The third and fourth stack layers 180 and 190 may be etched using the etchback process and/or the CMP process to form the third and fourth stack patterns 184 and 194.

The third and fourth stack patterns 184 and 194 may be formed to expose the first insulating layer 81 of the third active region 66. The first through fourth stack patterns 164, 174, 184, and 194 may be formed to sufficiently fill the second trench 85. Furthermore, the third through fifth preliminary buried patterns 123, 133, and 143 may be etched using the etchback process and/or the CMP process to form the third through fifth buried patterns 126, 136, and 146. The third through fifth buried patterns 126, 136, 146 may be formed to expose the first insulating layer 81 of the first active region 62.

The first through fifth buried patterns 106, 116, 126, 136, and 146 may be formed to sufficiently fill the first trench 83. The third through fifth buried patterns 126, 136, and 146 may have substantially the same top surface as the third and fourth stack patterns 184 and 194 in the upper portion of the semiconductor substrate 50. The third through fifth buried patterns 126, 136, and 146 and the third and fourth stack patterns 184 and 194 may have substantially the same top surface as the first insulating layer 81. The first through fifth buried patterns 106, 116, 126, 136, and 146 may constitute a first interconnection structure 153. The first through fourth stack patterns 164, 174, 184, and 194 may constitute a second interconnection structure 223.

Thereafter, a second insulating layer 240 may be formed on the first insulating layer 81 and the first and second interconnection structures 153 and 223. The second insulating layer 240 may include material having the same etch rate as or a different etch rate from the first insulating layer 81. The second insulating layer 240 may have the same etch rate as or a different etch rate from the third through fifth buried patterns 126, 136, and 146 and/or the third and fourth stack patterns 184 and 194.

As such, the first and second interconnection structures 153 and 223 may constitute a CMOS transistor 300 along with the semiconductor substrate 50. According to modified embodiments of the inventive concept, a method of forming a CMOS transistor 300 may include firstly forming first and second stack patterns 164 and 174 and third and fourth stack layers 180 and 190 in a second trench 85 of a third active region 66. Next, the method of forming the CMOS transistor 300 may further include forming first and second buried patterns 106 and 116 and third through fifth buried layers 120, 130, and 140 in a first trench 83 of a first active region 62.

Embodiment 2

Figure 13:
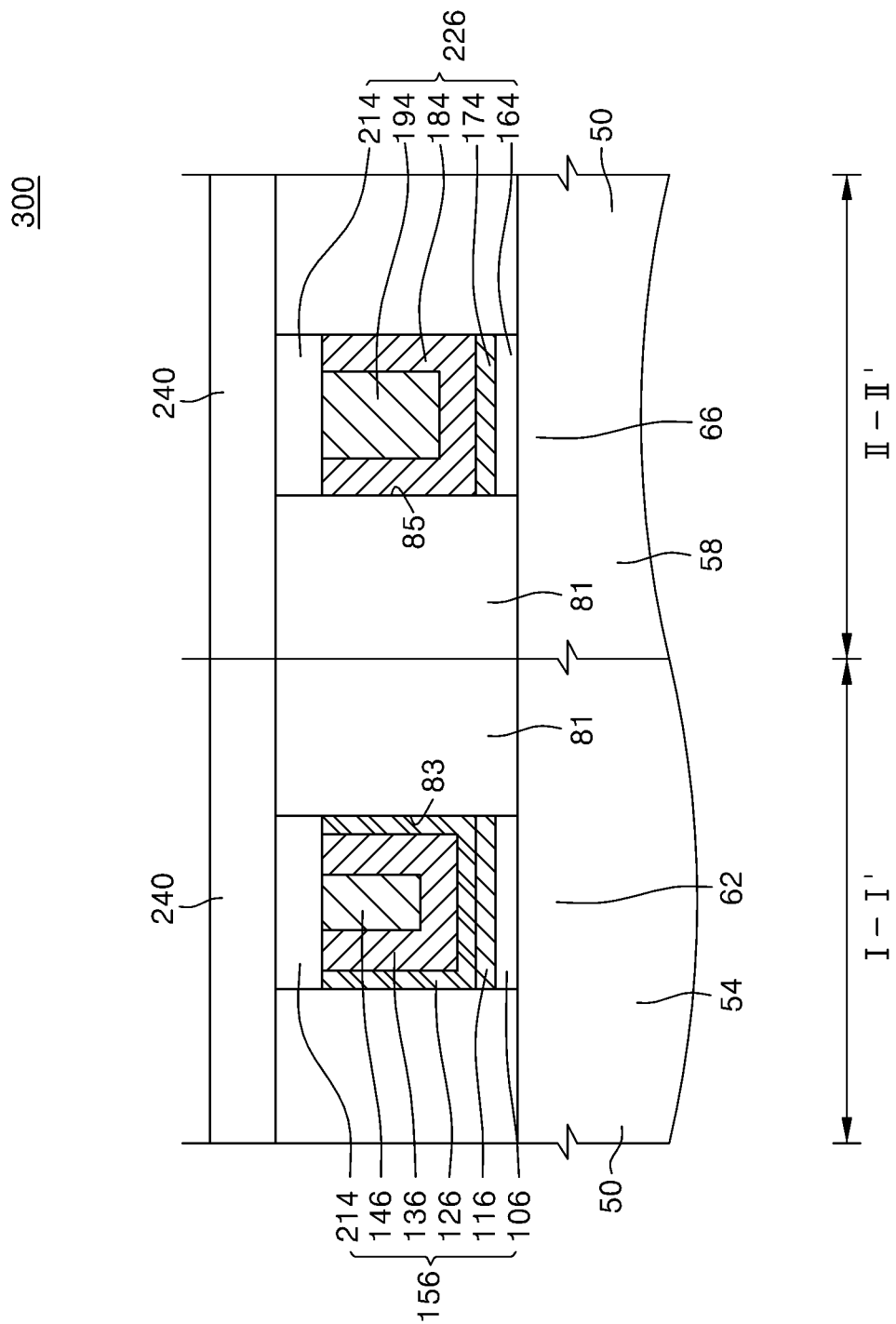
FIG. 13 is a schematic cross-sectional view taken along lines I-I' and II-II' of FIG. 7, illustrating a method of forming a CMOS transistor, according to embodiments of the inventive concept.

FIG. 13 is a schematic cross-sectional view taken along lines I-I' and II-II' of FIG. 7, illustrating a method of forming a CMOS transistor, according to embodiments of the inventive concept. In FIG. 13, the same reference numerals are used to denote the same elements as in FIGS. 9 through 12.

Referring to FIG. 13, according to embodiments of the inventive concept, an etchback process may be performed on the third through fifth preliminary buried patterns 123, 133, and 143 and the third and fourth stack layers 180 and 190 of FIG. 11. The third and fourth stack layers 180 and 190 may be etched using the etchback process, thereby forming third and fourth stack patterns 184 and 194.

The third and fourth stack patterns 184 and 194 may be formed under a top surface of a first insulating layer 81 of a third active region 66 to expose the first insulating layer 81. The first through fourth stack patterns 164, 174, 184, and 194 may be formed to partially fill the second trench 85. Also, the third through fifth preliminary buried patterns 123, 133, and 143 may be etched using the etchback process, thereby forming third through fifth buried patterns 126, 136, and 146. The third through fifth buried patterns 126, 136, and 146 may be formed under a top surface of the first insulating layer 81 of the first active region 62 to expose the first insulating layer 81.

The first through fifth buried patterns 106, 116, 126, 136, and 146 may be formed to partially fill the first trench 83. The third through fifth buried patterns 126, 136, and 146 may or may not have the substantially same top surface as the third and fourth stack patterns 184 and 194. First buried and stack capping patterns 214 may be formed on the first through fifth buried patterns 106, 116, 126, 136, and 146 and the first through fourth stack patterns 164, 174, 184, and 194. The first buried and stack capping patterns 214 may include material having the same etch rate as or a different etch rate from the first insulating layer 81.

The first buried and stack capping patterns 214 may be formed to fill upper portions of the first and second trenches 83 and 85, respectively. Top surfaces of the first buried and stack capping patterns 214 may or may not be disposed at substantially the same level as the top surface of the first insulating layer 81. The first through fifth buried patterns 106, 116, 126, 136, and 146 may constitute a first interconnection structure 156 along with the first buried capping pattern 214 in a first active region 62. The first through fourth stack patterns 164, 174, 184, and 194 may constitute a second interconnection structure 226 along with the first buried and stack capping pattern 214 in a third active region 66. A second insulating layer 240 may be formed on the first and second interconnection structures 153 and 226 to cover the first insulating layer 81. As such, the first and second interconnection structures 156 and 226 may be included in a CMOS transistor 300 along with a semiconductor substrate 50.

According to modified embodiments of the inventive concept, a method of forming a CMOS transistor 300 may include firstly forming first and second stack patterns 164 and 174 and third and fourth stack layers 180 and 190 in a second trench 85 of the third active region 66. Next, the method of forming the CMOS transistor 300 may further include forming first and second buried patterns 106 and 116 and third through fifth buried layers 120, 130, and 140 in a first trench 83 of the first active region 62.

Embodiment 3

Figure 14:
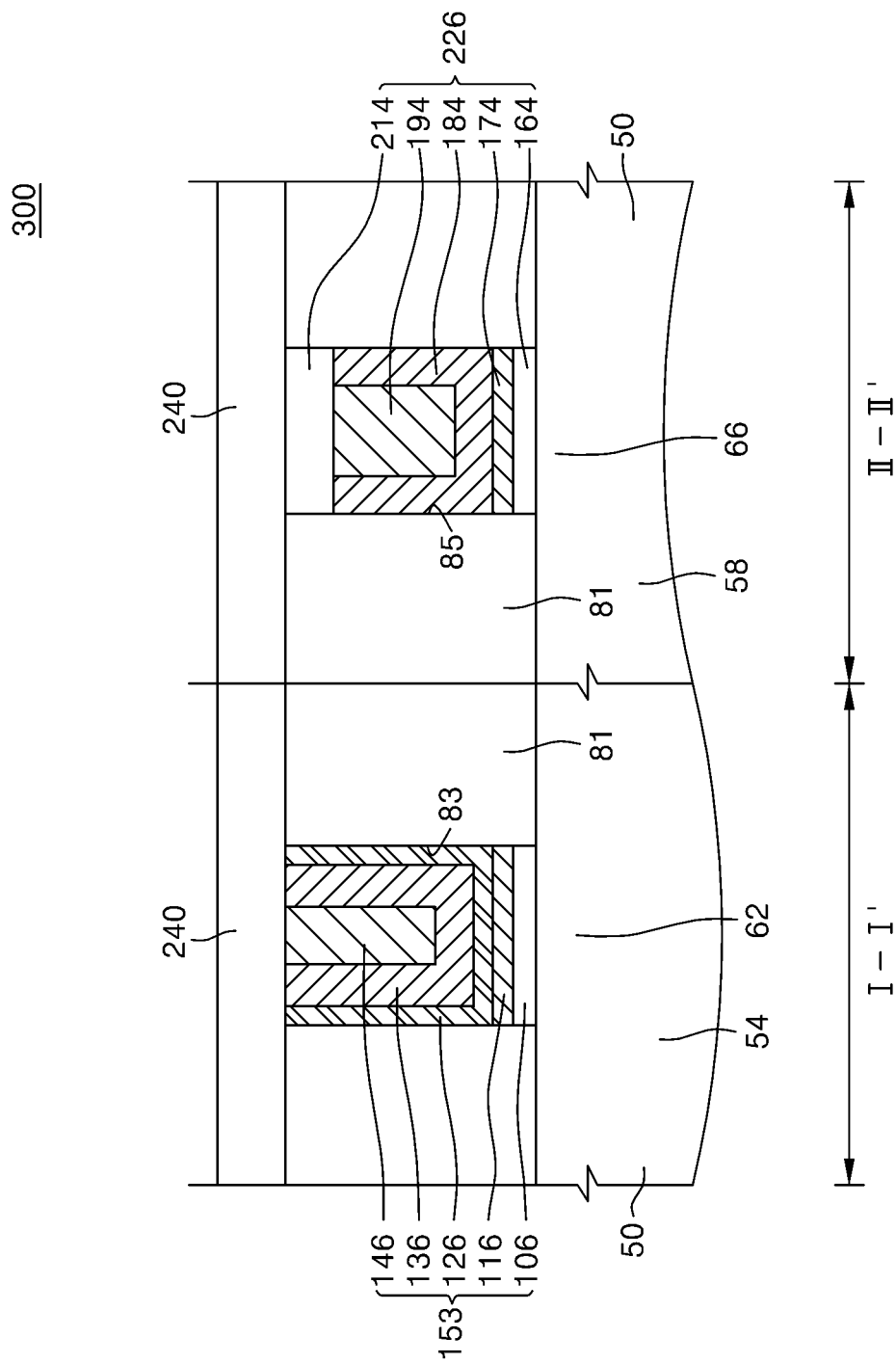
FIG. 14 is a schematic cross-sectional view taken along lines I-I' and II-II' of FIG. 7, illustrating a method of forming a CMOS transistor, according to embodiments of the inventive concept.

FIG. 14 is a schematic cross-sectional view taken along lines I-I' and II-II' of FIG. 7, illustrating a method of forming a CMOS transistor, according to embodiments of the inventive concept. In FIG. 14, the same reference numerals are used to denote the same elements as in FIGS. 12 and 13.

Referring to FIG. 14, according to embodiments of the inventive concept, first through fifth buried patterns 106, 116, 126, 136, and 146 may be formed in the first trench 83 of a first active region 62 as shown in FIG. 12. According to the embodiments of the inventive concept, first through fourth stack patterns 164, 174, 184, and 194 may be formed in the second trench 85 of a third active region 66 as shown in FIG. 12. A third mask (not shown) may be formed on a first insulating layer 81 of the first active region 62 to cover the first through fifth buried patterns 106, 116, 126, 136, and 146.

The third mask pattern may cover the entire p-type impurity diffusion region 54 of FIG. 7. The third mask pattern may include material having the same etch rate as or a different etch rate from the first insulating layer 81. An etchback process may be performed on the third and fourth stack patterns 184 and 194 using the third mask pattern of the first active region 62 and the first insulating layer 81 of the third active region 66 as an etch mask and an etch buffer layer, respectively. The etchback process may be performed to locate the third and fourth stack patterns 184 and 194 under a top surface of the first insulating layer 81.

The first through fourth stack patterns 164, 174, 184, and 194 may be formed to partially fill the second trench 85. After performing the etchback process, the third mask pattern may be removed from the first active region 62. Thereafter, the first stack capping pattern 214 of FIG. 13 may be formed to fill an upper portion of the second trench 85. Thus, the first through fifth buried patterns 106, 116, 126, 136, and 146 may constitute the first interconnection structure 153 of FIG. 12 on the first active region 62. The first through fourth stack patterns 164, 174, 184, and 194 may constitute the second interconnection structure 226 of FIG. 13 along with the first stack capping pattern 214.

A second insulating layer 240 may be formed on the first and second interconnection structures 153 and 226 to cover the first insulating layer 81. As such, the first and second interconnection structures 153 and 226 may be included in a CMOS transistor 300 along with a semiconductor substrate 50. According to modified embodiments of the inventive concept, a method of forming the CMOS transistor 300 may include firstly forming first and second stack patterns 164 and 174 and third and fourth stack layers 180 and 190 in the second trench 85 of a third active region 66.

Next, the method of forming the CMOS transistor 300 may further include forming first and second buried patterns 106 and 116 and third through fifth buried layer 120, 130, and 140 in a first trench 83 of a first active region 62. Also, the first buried capping pattern 214 of FIG. 13 may be formed only on third through fifth buried patterns 126, 136, and 146 instead of the first stack capping pattern 214 of FIG. 14. In this case, first through fifth buried patterns 106, 116, 126, 136, and 146 may constitute the first interconnection structure 156 of FIG. 13 along with the first buried capping pattern 214.

Embodiment 4

Figure 15:
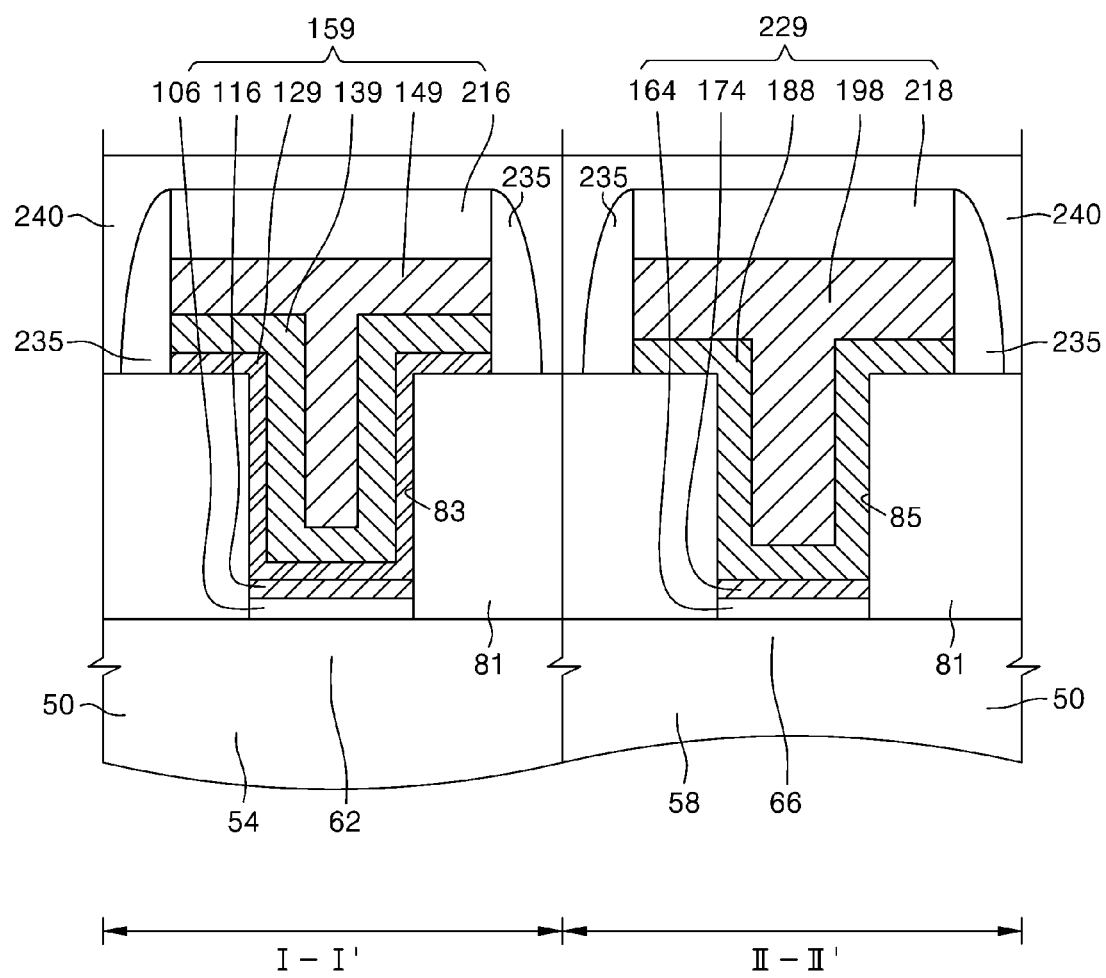
FIG. 15 is a schematic cross-sectional view taken along lines I-I' and II-II' of FIG. 7, illustrating a method of forming a CMOS transistor, according to embodiments of the inventive concept.

FIG. 15 is a schematic cross-sectional view taken along lines I-I' and II-II' of FIG. 7, illustrating a method of forming a CMOS transistor, according to embodiments of the inventive concept. In FIG. 15, the same reference numerals are used to denote the same elements as in FIGS. 10 through 12.

Referring to FIG. 15, according to embodiments of the inventive concept, a second buried capping layer (not shown) may be formed on the fifth buried layer 140 of FIG. 10. The second buried capping layer may include material having the same etch rate as or a different etch rate from the fifth buried layer 140. Primary semiconductor photolithography and etching processes may be performed on the third through fifth buried layers 120, 130, and 140 and the second buried capping layer. Thus, a photoresist pattern may be formed on the second buried capping layer using the primary semiconductor photolithography process.

The photoresist pattern may be aligned with the first trench 83 to expose the second buried capping layer. The primary semiconductor etching process may be performed on the third through fifth buried layers 120, 130, and 140 and the second buried capping layer using the photoresist pattern and a first insulating layer 81 as an etch mask and an etch buffer layer, respectively. The third through fifth buried layers 120, 130, and 140 and the second buried capping layer may be etched using the primary semiconductor etching process, thereby forming third through fifth buried patterns 129, 139, and 149 and a second buried capping pattern 216.

Upper portions of the third and fourth buried patterns 129 and 139 may protrude from a top surface of the first insulating layer 81. To this end, the upper portions of the third and fourth buried patterns 129 and 139 may extend to the top surface of the insulating layer 81, and may be sequentially formed parallel to a top surface of the semiconductor substrate 50. The fifth buried pattern 149 may be formed on the fourth buried pattern 139 to fill the first trench 83.

The first through fifth buried patterns 106, 116, 129, 139, and 149 and the second buried capping pattern 216 may constitute a first interconnection structure 159 in a first active region 62. The first interconnection structure 159 may be formed to expose the first insulating layer 81, and a fill pattern 89 in the third active region 66 of FIG. 10. After forming the first interconnection structure 159, the photoresist pattern may be removed from the semiconductor substrate 50. A fourth mask pattern (not shown) may be formed on the p-type impurity diffusion region 54 of FIG. 7 to cover the first interconnection structure 159.

The fourth mask pattern may include material having the same etch rate as or a different etch rate from the first insulating layer 81. Subsequently, as described with reference to FIG. 11, a protection layer 87 and the fill pattern 89 of FIG. 10 may be removed from the third active region 66 using the fourth mask pattern as an etch mask. The first and second stack patterns 164 and 174 and the third and fourth stack layers 180 and 190 of FIG. 11 may be formed in a second trench 85 of the third active region 66. A second stack capping layer (not shown) may be formed on the fourth stack layer 190.

The second stack capping layer may include material having the same etch rate as or a different etch rate from the fourth stack layer 190. Secondary semiconductor photolithography and etching processes may be performed on the third and fourth stack layers 180 and 190 and the second stack capping layer. Thus, a photoresist pattern may be formed on the second stack capping layer using the secondary semiconductor photolithography process. The photoresist pattern may expose the second stack capping layer and be aligned with the second trench 85. The secondary semiconductor etching process may be performed on the third and fourth stack layers 180 and 190 and the second stack capping layer using the photoresist pattern and the first insulating layer 81 as an etch mask and an etch buffer layer, respectively.

The third and fourth stack layers 180 and 190 and the second stack capping layer may be etched using the secondary semiconductor etching process, thereby forming third and fourth stack patterns 188 and 198 and a stack capping pattern 218. An upper portion of the third stack pattern 188 may protrude from the top surface of the first insulating layer 81. To this end, the upper portion of the third stack pattern 188 may extend to the top surface of the first insulating layer 81 and may be sequentially formed parallel to the top surface of the semiconductor substrate 50.

The fourth stack pattern 198 may be formed on the third stack pattern 188 to fill the second trench 85. The first through fourth stack patterns 164, 174, 188, and 198 and the second stack capping pattern 218 may constitute a second interconnection structure 229 in the third active region 66. After forming the second interconnection structure 229, the photoresist pattern and the fourth mask pattern may be removed from the semiconductor substrate 50. Spacers 235 may be formed on sidewalls of the first and second interconnection structures 159 and 229.

The spacers 235 may include material having the same etch rate as or a different etch rate from the second buried capping pattern 216 and/or the second stack capping pattern 218. A second insulating layer 240 may be formed on the semiconductor substrate 50 to cover the first and second interconnection structures 159 and 229 and the spacers 235. As such, the first and second interconnection structures 159 and 229 may be included in a CMOS transistor 300 along with the semiconductor substrate 50.

According to modified embodiments of the inventive concept, a method of forming a CMOS transistor 300 may include firstly forming first through fourth stack patterns 164, 174, 188, and 198 and the second stack capping pattern 218 in the second trench 85 of the third active region 66. Next, the method of forming the CMOS transistor 300 may further include forming first through fifth buried patterns 106, 116, 129, 139, and 149 and the second buried capping pattern 216 in the first trench 83 of the first active region 62.
Embodiment 5

Figure 16:
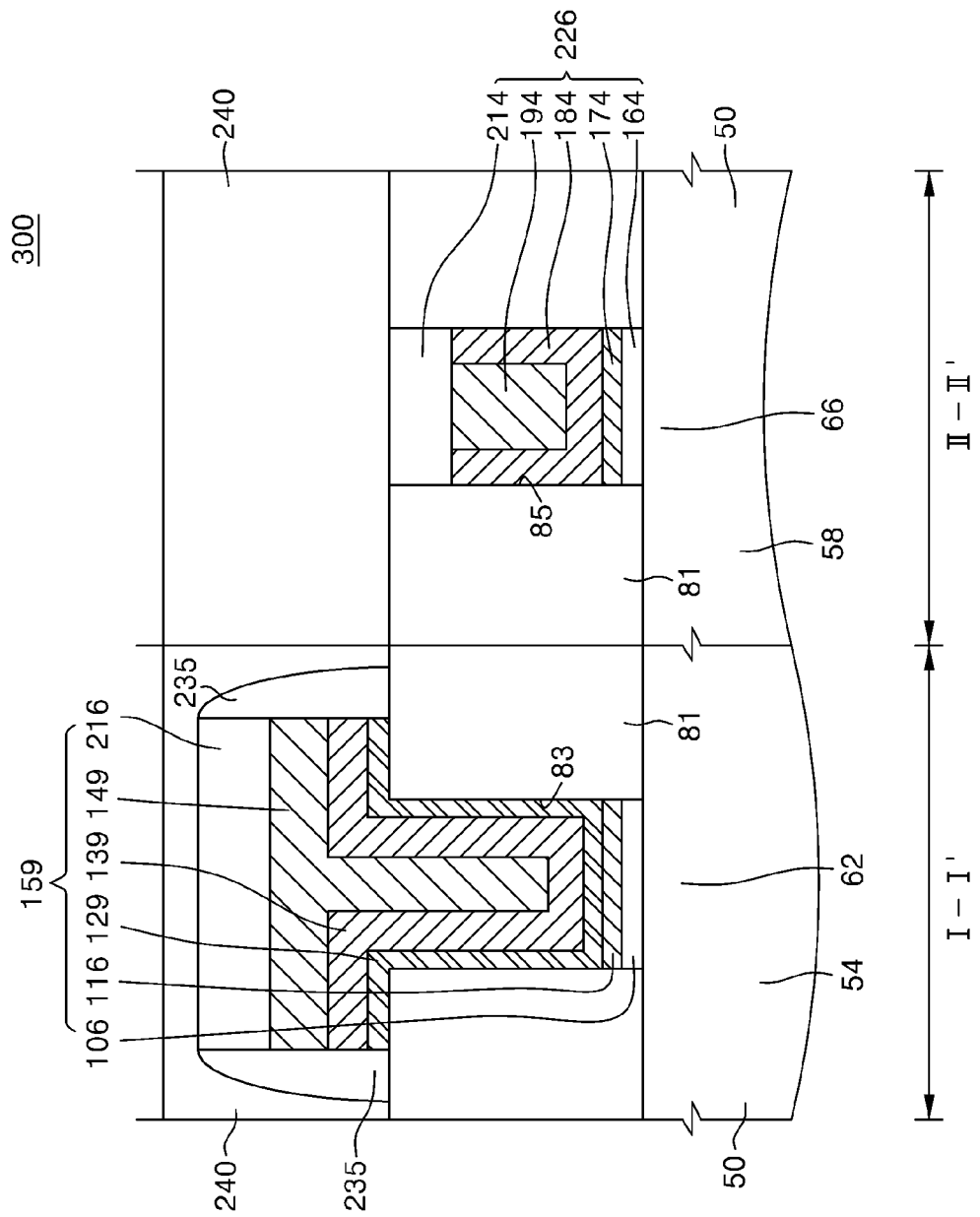
FIG. 16 is a schematic cross-sectional view taken along lines I-I' and II-II' of FIG. 7, illustrating a method of forming a CMOS transistor, according to embodiments of the inventive concept.

FIG. 16 is a schematic cross-sectional view taken along lines I-I' and II-II' of FIG. 7, illustrating a method of forming a CMOS transistor, according to embodiments of the inventive concept. In FIG. 16, the same reference numerals are used to denote the same elements as in FIGS. 14 and 15.

Referring to FIG. 16, according to embodiments of the inventive concept, the first interconnection structure 159 of FIG. 15 may be formed in a first trench 83 of a first active region 62. After forming the first interconnection structure 159, the fourth mask pattern of FIG. 15 may be formed to cover the first interconnection structure 159. Before forming the fourth mask pattern, spacers 235 may be formed on sidewalls of the first interconnection structure 159. Subsequently, as described with reference to FIG. 11, a protection layer 87 and a fill pattern 89 of FIG. 1 may be removed from a third active region 66 using the fourth mask pattern as an etch mask.

The first and second stack patterns 164 and 174 and the third and fourth stack layers 180 and 190 of FIG. 11 may be formed in a second trench 85 of the third active region 66. By using the fourth mask pattern and the first insulating layer 81 as an etch mask and an etch buffer layer, respectively, an etchback process may be performed on the third and fourth stack layers 180 and 190. The third and fourth stack layers 180 and 190 may be etched using the etchback process, thereby forming third and fourth stack patterns 184 and 194.

The third and fourth stack patterns 184 and 194 may be formed under a top surface of the first insulating layer 81 to partially fill the second trench 85. The first stack capping pattern 214 of FIG. 14 may be formed on the third and fourth stack patterns 184 and 194. The first stack capping pattern 214 may constitute the second interconnection structure 226 of FIG. 14 along with the first through fourth stack patterns 164, 174, 184, and 194. After forming the first stack capping pattern 214, the fourth mask pattern may be removed from the semiconductor substrate 50.

Subsequently, a second insulating layer 240 may be formed to cover the first and second interconnection structures 159 and 226 and the spacers 235. As such, the first and second interconnection structures 159 and 226 may be included in a CMOS transistor 300 along with the semiconductor substrate 50. According to modified embodiments of the inventive concept, a method of forming a CMOS transistor 300 may include forming the first interconnection structure 1 of FIG. 13 in the first trench 83 of the first active region 62 and forming the second interconnection structure of FIG. 15 in the second trench 85 of the third active region 66.

Embodiment 6

Figure 17:
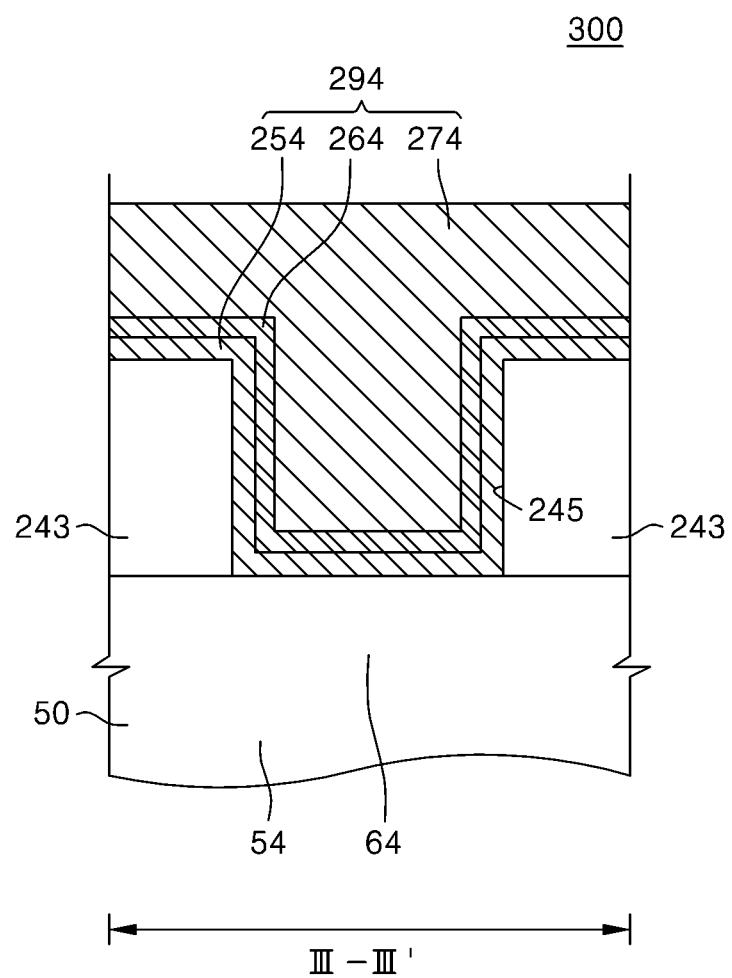
FIG. 17 is a schematic cross-sectional views taken along line III-III' of FIG. 7, illustrating a method of forming a CMOS transistor, according to embodiments of the inventive concept.

FIG. 17 is a schematic cross-sectional views taken along line III-III' of FIG. 7, illustrating a method of forming a CMOS transistor, according to embodiments of the inventive concept.

Referring to FIG. 17, according to embodiments of the inventive concept, the semiconductor substrate 50 of FIG. 9 may be prepared. The semiconductor substrate 50 may include a second active region 64 in the n-type impurity diffusion region 54 of FIG. 7. The semiconductor substrate 50 may have a third insulating layer 243 on the second active region 64. The third insulating layer 243 may include the first and second insulating layers 81 and 240 described with reference to FIGS. 8 through 16. A connection hole 245 may be formed in the third insulating layer 243. The connection hole 245 may expose the second active region 64. First and second barrier layers (not shown) may be sequentially formed on the third insulating layer 243 to conformally cover the connection holes 245.

The first and second barrier layers may include the same material as the second buried pattern 116 and the third buried layer 120 of FIG. 10. An interconnection layer (not shown) may be formed on the second barrier layer to fill the connection hole 245. The interconnection layer may include the same material as the fifth buried layer 140 of FIG. 10. Third semiconductor photolithography and etching processes may be performed on the first and second barrier layers and the interconnection layer. A photoresist pattern may be formed on the interconnection layer using the third semiconductor photolithography process. The photoresist pattern may overlap the third interconnection structure 294 of the second active region 64 of FIG. 7.

By using the photoresist pattern and the third insulating layer 243 as an etch mask and an etch buffer layer, respectively, the first and second barrier layers and the interconnection layer may be etched using the third semiconductor etching process, thereby forming first and second barrier patterns 254 and 264 and an interconnection 274. After forming the first and second barrier patterns 254 and 264 and the interconnection 274, the photoresist pattern may be removed from the semiconductor substrate 50. As such, the first and second barrier patterns 254 and 264 and the interconnection 274 may constitute the third interconnection structure 294.

The third interconnection structure 294 may be included in a CMOS transistor 300 according to embodiments of the inventive concept. The connection hole 245 may be formed on each of first, third, and fourth active regions 62, 66, and 68, the first interconnection structure 153, 156, or 159, and the second interconnection structure 223, 226 or 229 as shown in FIG. 7. The connection hole 245 may be formed in the third insulating layer 243 to expose each of the first, third, and fourth active regions 62, 66, and 68, the first interconnection structure 153, 156, or 159, and the second interconnection structure 223, 226, or 229. The third interconnection structure 294 may be formed in the connection hole 245 of each of the first, third and fourth active regions 62, 66, or 68, the first interconnection structure 153, 156, or 159, and the second interconnection structure 223, 226, or 229.

In this case, the third interconnection structure 294 may be in contact with a top surface of the first interconnection structure 153, 156, or 159. The third interconnection structure 294 may be in contact with a top surface of the second interconnection structure 223, 226, or 229. The third interconnection structure 294 may apply an external power source to each of the first through fourth active regions 62, 64, 66, and 68. The external power source of the third interconnection structure 294 may be applied to each of the first interconnection structure 153, 156, or 159 and the second interconnection structure 223, 226, or 229.

Embodiment 7

Figure 18:
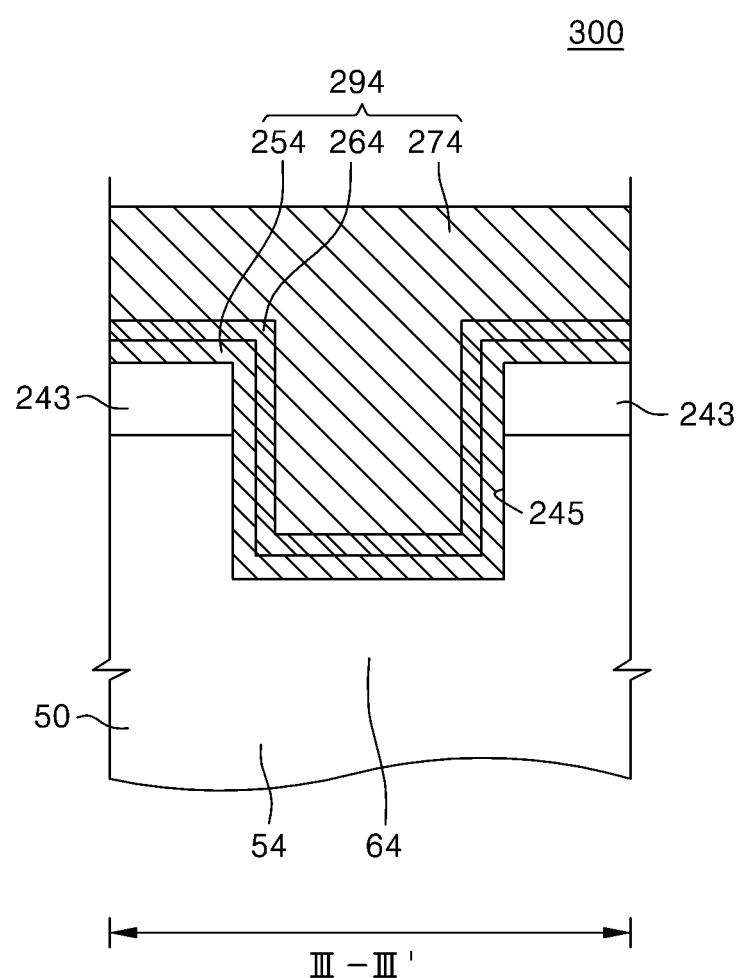
FIG. 18 is a schematic cross-sectional views taken along line III-III' of FIG. 7, illustrating a method of forming a CMOS transistor, according to embodiments of the inventive concept.

FIG. 18 is a schematic cross-sectional view taken along line III-III' of FIG. 7, illustrating a method of forming a CMOS transistor, according to embodiments of the inventive concept. In FIG. 18, the same reference numerals are used to denote the same elements as in FIG. 17.

Referring to FIG. 18, according to embodiments of the inventive concept, a connection hole 245 may be formed in the semiconductor substrate 50 and the third insulating layer 243 of FIG. 17. The connection hole 245 may extend under a top surface of a second active region 64 through the third insulating layer 243. The connection hole 245 may be formed in each of first, third, and fourth active regions 62, 66 and 68, a first interconnection structure 153, 156, or 159, and a second interconnection structure 223, 226, or 229 as shown in FIG. 7.

The third interconnection structure 294 of FIG. 17 may be formed on the third insulating layer 243 to fill the connection hole 245. The third interconnection structure 294 of the second active region 64 may be included in a CMOS transistor 300 according to embodiments of the inventive concept. The third interconnection structure 294 may be formed in the connection hole 245 formed in each of the first, third, and fourth active regions 62, 66, and 68, the first interconnection structure 153, 156, or 159, and the second interconnection structure 223, 226, or 229. In this case, the third interconnection structure 294 may be partially inserted into the first interconnection structure 153, 156, or 159 through a top surface of the first interconnection structure 153, 156, or 159.

The third interconnection structure 294 may be partially inserted into the second interconnection structure 223, 226, or 229 through a top surface of the second interconnection structure 223, 226, or 229.

Embodiment 8

Figure 19:
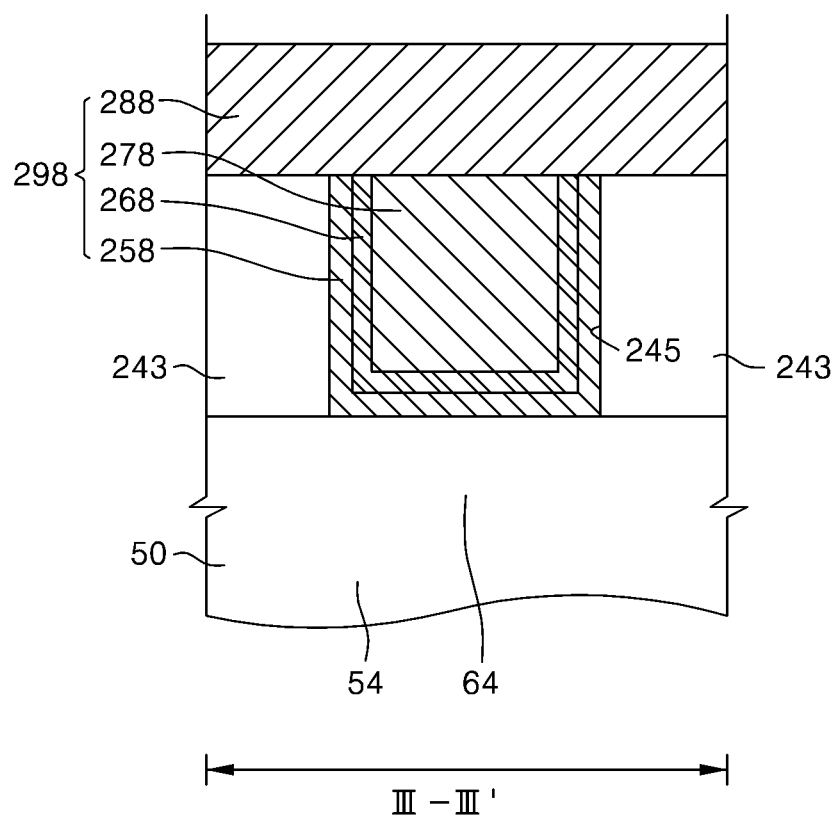
FIG. 19 is a schematic cross-sectional views taken along line III-III' of FIG. 7, illustrating a method of forming a CMOS transistor, according to embodiments of the inventive concept.

FIG. 19 is a schematic cross-sectional view taken along line III-III' of FIG. 7, illustrating a method of forming a CMOS transistor, according to embodiments of the inventive concept. In FIG. 19, the same reference numerals are used to denote the same elements as in FIG. 17.

Referring to FIG. 19, according to embodiments of the inventive concept, a connection hole 245 may be formed on the semiconductor substrate 50 to penetrate the third insulating layer 243 of FIG. 17. The connection hole 245 may expose a second active region 64. The first and second barrier layers of FIG. 17 may be formed on the third insulating layer 243 to conformally cover the connection hole 245. A first interconnection layer may be formed on the second barrier layer to fill the connection hole 245. The first interconnection layer may include the same material as or different material from the interconnection layer of FIG. 17. An etchback process and/or a CMP process may be performed on the first and second barrier layers and the first interconnection layer.

The first and second barrier layers and the first interconnection layer may be etched using the etchback process and/or the CMP process, thereby forming first and second barrier patterns 258 and 268 and a first interconnection 278 to fill the connection hole 245 and expose the third insulating layer 243. A second interconnection layer (not shown) may be formed on the third insulating layer 243 to cover the first and second barrier patterns 258 and 268 and the first interconnection 278. The second interconnection layer may include the same material as or different material from the first interconnection 278. Fourth semiconductor photolithography and etching processes may be performed on the second interconnection layer.

A photoresist pattern may be formed on the second interconnection using the fourth semiconductor photolithography process. The photoresist pattern may overlap the third interconnection structure 298 of the second active region 64 of FIG. 7. By using the photoresist pattern and the third insulating layer 243 as an etch mask and an etch buffer layer, respectively, the fourth semiconductor etching process may be performed on the second interconnection layer. The second interconnection layer may be etched using the fourth semiconductor etching process to expose the third insulating layer 243, thereby forming the second interconnection 288.

The second interconnection 288 may constitute the third interconnection structure 298 along with the first and second barrier patterns 258 and 268 and the first interconnection 278. The third interconnection structure 298 may be included in a CMOS transistor 300 according to embodiments of the inventive concept. The connection hole 245 may be formed on each of the first, third, and fourth active regions 62, 66, and 68, the first interconnection structure 153, 156, or 159, and the second interconnection structure 223, 226, or 229 as shown in FIG. 7.

The third interconnection structure 298 may be formed in the connection hole 245 formed in each of the first, third, and fourth active regions 62, 66 and 68, the first interconnection structure 153, 156, or 159, and the second interconnection structure 223, 226, or 229. In this case, the third interconnection structure 298 may be in contact with a top surface of the first interconnection structure 153, 156, or 159. The third interconnection structure 298 may be in contact with a top surface of the second interconnection structure 223, 226, or 229.

Embodiment 9

Figure 20:
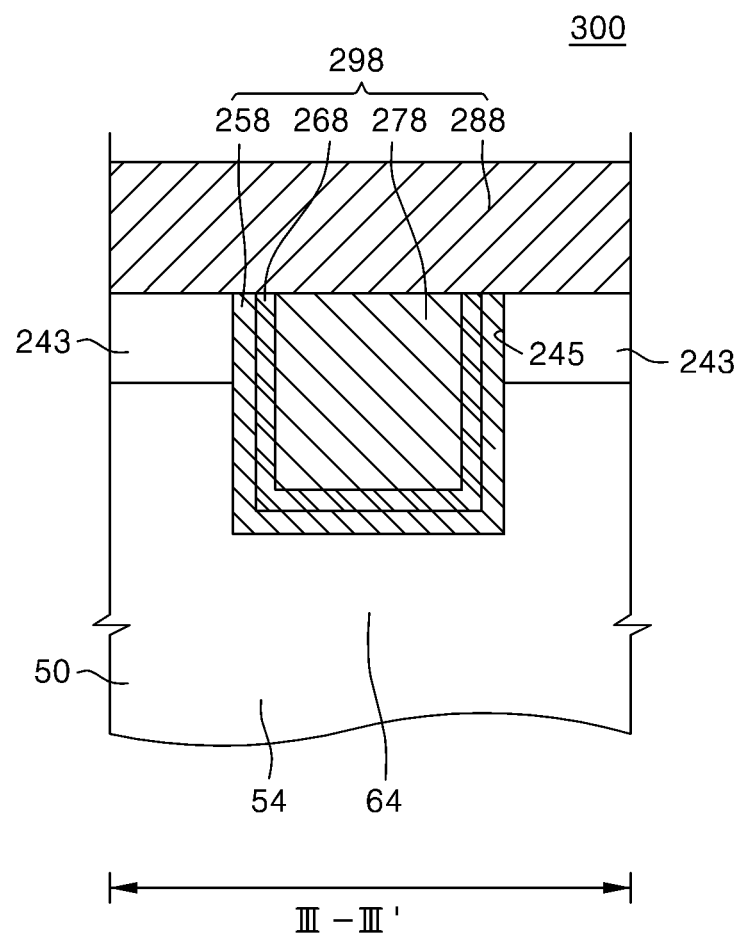
FIG. 20 is a schematic cross-sectional views taken along line III-III' of FIG. 7, illustrating a method of forming a CMOS transistor, according to embodiments of the inventive concept.

FIG. 20 is a schematic cross-sectional view taken along line III-III' of FIG. 7, illustrating a method of forming a CMOS transistor, according to embodiments of the inventive concept. In FIG. 20, the same reference numerals are used to denote the same elements as in FIG. 19.

Referring to FIG. 20, according to embodiments of the inventive concept, a connection hole 245 may be formed in the semiconductor substrate 50 and the third insulating layer 243 of FIG. 19. The connection hole 245 may extend under a top surface of a second active region 64 through the third insulating layer 243. The connection hole 245 may be formed on each of first, third, and fourth active regions 62, 66, and 68, first interconnection structure 153, 156, or 159, and second interconnection structure 223, 226, or 229 as shown in FIG. 7.

The third interconnection structure 298 of FIG. 19 may be formed on the third insulating layer 243 to fill the connection hole 245. The third interconnection structure 298 of the second active region 64 may be included in a CMOS transistor 300 according to embodiments of the inventive concept. The third interconnection structure 298 may be formed in each of the first, third, and fourth active regions 62, 66, and 68, the first interconnection structure 153, 156, or 159, and the second interconnection structure 223, 226, or 229.

In this case, the third interconnection structure 298 may be partially inserted into the first interconnection structure 153, 156, or 159 through a top surface of the first interconnection structure 153, 156, or 159. The third interconnection structure 298 may be partially inserted into the second interconnection structure 223, 226, or 229 through a top surface of the second interconnection structure 223, 226, or 229.

Figure 21:
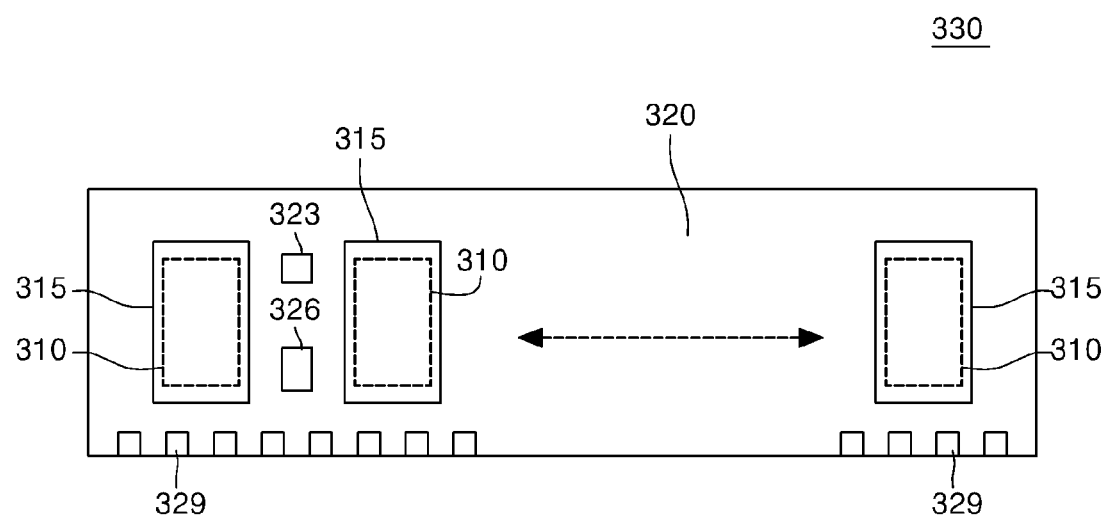
FIG. 21 is a schematic plan view of a semiconductor module including a semiconductor device of FIG. 7.

FIG. 21 is a schematic plan view of a semiconductor module including a semiconductor device of FIG. 7.

Referring to FIG. 21, a semiconductor module 330 according to embodiments of the inventive concept may include a module substrate 320. The module substrate 320 may be a printed circuit board (PCB), or a plate including an electrical circuit. The module substrate 320 may include internal circuits (not shown), electrical pads (not shown), and connectors 329. The internal circuits may be electrically connected to the electrical pads and the connectors 329. Semiconductor package structures 315 and at least one resistor 323 may be disposed on the module substrate 320.

Alternatively, the semiconductor package structures 315, the at least one resistor 323, and at least one condenser 326 may be disposed on the module substrate 320. The semiconductor package structures 315 may be electrically connected to the electrical pads along with the at least one resistor 323 and/or the at least one condenser 326. Each of the semiconductor package structures 315 may include at least one semiconductor device 310, which may include at least one CMOS transistor 300 of FIG. 7.

The CMOS transistor 300 may include a p-type impurity diffusion region 54 and an n-type impurity diffusion region 58. The p-type impurity diffusion region 54 may include the first and second active regions 62 and 64 of FIG. 7 in the semiconductor substrate 50 of FIG. 9. The first active region 62 may include the first interconnection structure 153, 156, or 159 of FIG. 7. The selected third interconnection structures 294 or 298 of FIG. 7 may be disposed on the first and second active regions 62 and 64 and the first interconnection structure 153, 156, or 159.

The n-type impurity diffusion region 58 may include the third and fourth active regions 66 and 68 of FIG. 7 in the semiconductor substrate 50 of FIG. 9. The third active region 66 may include the second interconnection structure 223, 226, or 229 of FIG. 7. The remaining third interconnection structures 294 or 298 may be disposed on the third and fourth active regions 66 and 68 and the second interconnection structure 223, 226, or 229. Thus, the semiconductor module 330 may have better electrical properties than in the conventional art.

Figure 22:
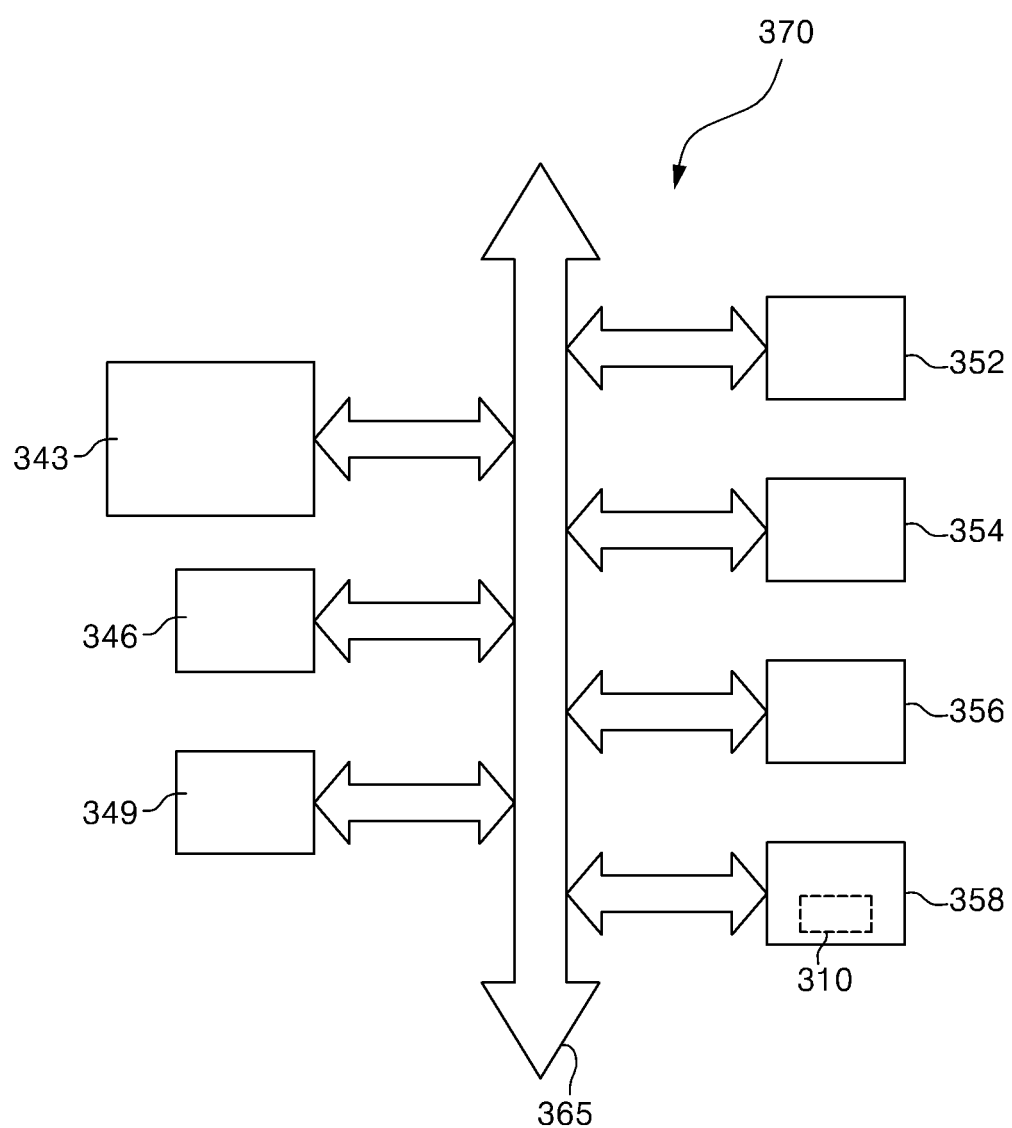
FIG. 22 is a schematic plan view of a processor-based system including a semiconductor device of FIG. 7.

The semiconductor module 330 may be electrically connected to the processor-based system 370 of FIG. 22 through the connectors 329 of the module substrate 320.

FIG. 22 is a schematic plan view of a processor-based system including a semiconductor device of FIG. 7.

Referring to FIG. 22, a processor-based system 370 according to embodiments of the inventive concept may include at least one system board (not shown). The at least one system board may include at least one bus line 365. A first module unit may be disposed on the at least one bus line 365. The first module unit may be electrically connected to the at least one bus line 365.

The first module unit may include a central processing unit (CPU) 343, a floppy disk drive (FDD) 346, and a compact disk read-only-memory (ROM) drive 349. Also, a second module unit may be disposed on the at least one bus line 365. The second module unit may be electrically connected to the at least one bus line 365.

The second module unit may include a first input/output (I/O) device 352, a second I/O device 354, a ROM 356, and a random access memory (RAM) 358. The RAM 358 may include the semiconductor module 330 of FIG. 21, according to embodiments of the inventive concept, or only the semiconductor device 310 of FIG. 7. The ROM 356 may include the semiconductor device 310 according to embodiments of the inventive concept. In this construction, the processor-based system 370 may have better electrical properties than in the conventional art.

The processor-based system 370 may include a computer system, a process control system, or other systems.

As described above, embodiments of the inventive concept provide a CMOS transistor which includes a plurality of stacked diffusion stopping materials disposed under work-function adjusting material. The diffusion stopping materials may prevent diffusion of constituent atoms of the power applying material and protect insulating material thereunder. The diffusion stopping materials may control a threshold voltage of the CMOS transistor to a desired value.

As a result, the CMOS transistor using the diffusion stopping materials may have better electrical properties than in the prior art. Also, the CMOS transistor may be disposed in a semiconductor device so that the electrical properties of the semiconductor device can be improved over those in the prior art. Furthermore, the semiconductor device may be disposed in a semiconductor module and/or a processor-based system so that the electrical properties of the semiconductor module and/or the processor-based system can be improved over those in the prior art.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device comprising:
a substrate including a first region doped with a first conductivity type impurity and a second region doped with a second conductivity type impurity;
a first insulating layer disposed on the substrate and including a first trench in the first region and a second trench in the second region;
a first gate insulating layer disposed in the first trench;
a first metal nitride layer disposed on the first gate insulating layer;
a first concave-shaped metal containing layer disposed on the first metal nitride layer;
a second concave-shaped metal containing layer disposed on the first concave-shaped metal containing layer;
a first filling layer disposed on the second concave-shaped metal containing layer;
a first capping layer disposed on a top surface of the first filling layer, on a top surface of the first concave-shaped metal containing layer, and on a top surface of the second concave-shaped metal containing layer in the first trench and filling the first trench;
a second gate insulating layer disposed in the second trench;
a second metal nitride layer disposed on the second gate insulating layer;
a third concave-shaped metal containing layer disposed on the second metal nitride layer;
a second filling layer disposed on the third concave-shaped metal containing layer; and
a second capping layer disposed on a top surface of the second filling layer and on a top surface of the third concave-shaped metal containing layer in the second trench and filling the second trench,
wherein a bottom surface of the first filling layer is disposed higher than a bottom surface of the second filling layer,
the first capping layer includes a material having an etching rate different from that of the first insulating layer, and
the second capping layer includes a material having an etching rate different from that of the first insulating layer.

2. The semiconductor device of claim 1, wherein the first region includes a p-type impurity diffusion region, and
the second region includes an n-type impurity diffusion region.

3. The semiconductor device of claim 1, wherein the second concave-shaped metal containing layer is not formed on an upper surface of a first sidewall of the first concave-shaped metal containing layer and not formed on an upper surface of a second sidewall of the first concave-shaped metal containing layer.

4. The semiconductor device of claim 1, wherein the second filling layer is thicker than the first filling layer.

5. The semiconductor device of claim 1, wherein the second filling layer is wider than the first filling layer.

6. The semiconductor device of claim 1, further comprising a second insulating layer disposed on the first insulating layer.

7. The semiconductor device of claim 1, wherein each of the first gate insulating layer and the second gate insulating layer includes a hafnium-based material and/or a lanthanide-based material.

8. The semiconductor device of claim 1, wherein each of the first metal nitride layer and the second metal nitride layer is either binary-based metal nitride or ternary-based metal nitride.

9. The semiconductor device of claim 1, wherein each of the first metal nitride layer and the second metal nitride layer includes HfN, TaN, TiN, WN, HfAlN, TaAlN or TiAlN.

10. The semiconductor device of claim 1, wherein the first concave-shaped metal containing layer includes silicon nitride, silicon carbide, or silicide of one selected from the group consisting of hafnium (Hf), molybdenum (Mo), tantalum (Ta), titanium (Ti) and tungsten (W).

11. The semiconductor device of claim 1, wherein the first concave-shaped metal containing layer includes HfAlN, HfSiN, TaAlN, TaSiN, TiAlN or TiSiN.

12. The semiconductor device of claim 1, wherein each of the second concave-shaped metal containing layer and the third concave-shaped metal containing layer includes carbide, nitride, silicon nitride or silicide of one selected from the group consisting of Hf, Mo, Ta, Ti and W, or includes platinum (Pt), ruthenium (Ru), iridium oxide (IrO) or ruthenium oxide (RuO).

13. The semiconductor device of claim 1, wherein the second concave-shaped metal containing layer includes the same material as the third concave-shaped metal containing layer, or includes a different material from the third concave-shaped metal containing layer.

14. A semiconductor device comprising:
a substrate including a first region doped with a first conductivity type impurity and a second region doped with a second conductivity type impurity;
an insulating layer disposed on the substrate and including a first trench in the first region and a second trench in the second region;
a first gate insulating layer disposed in the first trench;
a first metal nitride layer disposed on the first gate insulating layer;
a first concave-shaped metal containing layer disposed on the first metal nitride layer;
a second concave-shaped metal containing layer disposed on the first concave-shaped metal containing layer;
a first filling layer disposed on the second concave-shaped metal containing layer;
a first capping layer disposed on a top surface of the first filling layer, on a top surface of the first concave-shaped metal containing layer, and on a top surface of the second concave-shaped metal containing layer in the first trench and filling the first trench;
a second gate insulating layer disposed in the second trench;
a second metal nitride layer disposed on the second gate insulating layer;
a third concave-shaped metal containing layer disposed on the second metal nitride layer;
a second filling layer disposed on the third concave-shaped metal containing layer; and
a second capping layer disposed on a top surface of the second filling layer and on a top surface of the third concave-shaped metal containing layer in the second trench and filling the second trench,
wherein a bottom surface of the first filling layer is disposed higher than a bottom surface of the second filling layer, and
a top surface of the insulating layer is coplanar with a top surface of the first capping layer and with a top surface of the second capping layer.

15. The semiconductor device of claim 14, wherein each of the first and second capping layers includes a material having an etching rate different from that of the insulating layer.

16. The semiconductor device of claim 14, wherein a bottom surface of the second concave-shaped metal containing layer is disposed higher than a bottom surface of the third concave-shaped metal containing layer.

17. The semiconductor device of claim 14, further comprising a second insulating layer disposed on the insulating layer.

18. A semiconductor device comprising:
a substrate;
a first insulating layer disposed on the substrate and including a trench;
a gate insulating layer disposed in the trench;
a metal nitride layer disposed on the gate insulating layer;
a first concave-shaped metal containing layer disposed on the metal nitride layer, and including a bottom portion, a first sidewall and a second sidewall;
a second concave-shaped metal containing layer disposed on the first concave-shaped metal containing layer;
a filling layer disposed on the second concave-shaped metal containing layer; and
a capping layer disposed on a top surface of the filling layer, on a top surface of the first concave shaped metal containing layer and on a top surface of the second concave-shaped metal containing layer in the trench and filling the trench,
wherein the second concave-shaped metal containing layer is not formed on an upper surface of the first sidewall of the first concave-shaped metal containing layer and not formed on an upper surface of the second sidewall of the first concave-shaped metal containing layer, and
the capping layer includes a material having an etching rate different from that of the first insulating layer.

19. The semiconductor device of claim 18, wherein the gate insulating layer is disposed on the substrate in the trench.

20. The semiconductor device of claim 18, wherein the second concave-shaped metal containing layer includes a bottom layer, a first sidewall and a second sidewall.

21. The semiconductor device of claim 20, wherein the bottom layer of the second concave-shaped metal containing layer is disposed on the bottom layer of the first concave-shaped metal containing layer,
the first sidewall of the second concave-shaped metal containing layer are disposed on the first sidewall of the first second concave-shaped metal containing layer, and
the second sidewall of the second concave-shaped metal containing layer are disposed on the second sidewall of the first second concave-shaped metal containing layer.

22. The semiconductor device of claim 20, wherein the filling layer fills a space defined by the bottom layer, the first sidewall and the second sidewall of the second concave-shaped metal containing layer.

23. The semiconductor device of claim 18, further comprising a second insulating layer disposed on the first insulating layer and on the capping layer.

24. The semiconductor device of claim 18, wherein an upper surface of the filling layer is coplanar with an upper surface of the second concave-shaped metal containing layer.

25. The semiconductor device of claim 18, wherein an upper surface of the capping layer is coplanar with an upper surface of the first insulating layer.

26. The semiconductor device of claim 18, wherein the first concave-shaped metal containing layer includes HfAlN, HfSiN, TaAlN, TaSiN, TiAlN or TiSiN.

27. The semiconductor device of claim 18, wherein the second concave-shaped metal containing layer includes carbide, nitride, silicon nitride or silicide of one selected from the group consisting of Hf, Mo, Ta, Ti and W, or includes platinum (Pt), ruthenium (Ru), iridium oxide (IrO) or ruthenium oxide (RuO).

28. A semiconductor device comprising:
a substrate;
a first insulating layer disposed on the substrate and including a trench;
a gate insulating layer disposed in the trench;
a metal nitride layer disposed on the gate insulating layer;
a first concave-shaped metal containing layer disposed on the metal nitride layer, and including a bottom portion, a first sidewall and a second sidewall;
a second concave-shaped metal containing layer disposed on the first concave-shaped metal containing layer;
a filling layer disposed on the second concave-shaped metal containing layer;
a capping layer disposed on a top surface of the filling layer, on a top surface of the first concave-shaped metal containing layer, and on a top surface of the second concave-shaped metal containing layer in the trench and filling the trench; and a second insulating layer disposed on the first insulating layer, wherein the capping layer includes a material having an etching rate different from that of the first insulating layer.

29. The semiconductor device of claim 28, wherein the second concave-shaped metal containing layer is not formed on an upper surface of the first sidewall of the first concave-shaped metal containing layer and not formed on an upper surface of the second sidewall of the first concave-shaped metal containing layer.

30. The semiconductor device of claim 28, wherein an upper surface of the capping layer is coplanar with an upper surface of the first insulating layer.

* * * * *